(12) United States Patent
Yoo et al.

(10) Patent No.: US 12,082,357 B2
(45) Date of Patent: Sep. 3, 2024

(54) ELECTRONIC DEVICE INCLUDING FLEXIBLE DISPLAY

(71) Applicant: SAMSUNG ELECTRONICS CO., LTD., Suwon-si (KR)

(72) Inventors: Hyeryun Yoo, Suwon-si (KR); Youngtae Kim, Suwon-si (KR); Kiyul Lim, Suwon-si (KR); Wooktae Kim, Suwon-si (KR); Hyungjin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 17/855,115

(22) Filed: Jun. 30, 2022

(65) Prior Publication Data
US 2023/0008612 A1  Jan. 12, 2023

Related U.S. Application Data

(63) Continuation of application No. PCT/KR2022/008150, filed on Jun. 9, 2022.

(30) Foreign Application Priority Data

Jul. 1, 2021  (KR) .................... 10-2021-0086257

(51) Int. Cl.
*G06F 1/16*  (2006.01)
*H01B 1/02*  (2006.01)
(Continued)

(52) U.S. Cl.
CPC ............. *H05K 5/0217* (2013.01); *H01B 1/02* (2013.01); *H05K 5/0017* (2013.01)

(58) Field of Classification Search
CPC ................ G06F 1/1624; H04M 1/0268; H01L 51/0097; G09G 2380/02; G09F 9/301
See application file for complete search history.

(56) References Cited

U.S. PATENT DOCUMENTS 10,223,942 B2  3/2019  Chu
10,847,735 B2  11/2020  Seo
(Continued)

FOREIGN PATENT DOCUMENTS

CN  107870004 A  *  4/2018  ............... G01D 5/42
CN  107870004 A     4/2018
(Continued)

OTHER PUBLICATIONS

International Search Report (PCT/ISA/210) dated Oct. 4, 2022, issued by the International Searching Authority in International Application No. PCT/KR2022/008150.

*Primary Examiner* — Yuzhen Shen
(74) *Attorney, Agent, or Firm* — Sughrue Mion, PLLC

(57) ABSTRACT

An electronic device includes: a flexible display that is configured to be deformable to a first state, in which an exposed amount of a display area of the flexible display has a first size, and a second state, in which the exposed amount of the display area is expanded in a first direction; a deformable member including a liquid-state electrode, the deformable member configured to deform in a length direction based on the flexible display transitioning between the first state and the second state; a deformation sensing circuit configured to sense a resistance component of the liquid-state electrode, the resistance component corresponding to an exposure degree of the display area; a connector member electrically connecting the deformable member and the deformation sensing circuit; a rigid member coupled to the deformable member; and a fixed structure contacting a partial area of the rigid member.

20 Claims, 20 Drawing Sheets

(51) Int. Cl.
  *H05K 5/00*    (2006.01)
  *H05K 5/02*    (2006.01)

(56) References Cited

U.S. PATENT DOCUMENTS

| | | | |
|---|---|---|---|
| 10,936,100 B2 | 3/2021 | Park et al. | |
| 11,012,546 B1* | 5/2021 | Song | G06F 1/1656 |
| 11,206,322 B2 | 12/2021 | Cha et al. | |
| 11,360,598 B2 | 6/2022 | Park et al. | |
| 2017/0278436 A1 | 9/2017 | Chu | |
| 2018/0103544 A1* | 4/2018 | Holbery | C08K 7/00 |
| 2018/0247727 A1* | 8/2018 | Ronay | H01Q 1/38 |
| 2019/0384438 A1 | 12/2019 | Park et al. | |
| 2020/0212325 A1 | 7/2020 | Seo | |
| 2021/0099557 A1 | 4/2021 | Chat et al. | |
| 2021/0120688 A1* | 4/2021 | Wang | G06F 1/1681 |
| 2021/0149515 A1 | 5/2021 | Park et al. | |
| 2021/0400129 A1* | 12/2021 | Shim | H04M 1/0266 |

FOREIGN PATENT DOCUMENTS

| | | | | |
|---|---|---|---|---|
| KR | 10-2017-0136229 A | | 12/2017 | |
| KR | 20170136229 A | * | 12/2017 | ........... G06F 1/1652 |
| KR | 10-2019-0141518 A | | 12/2019 | |
| KR | 10-2020-0083872 A | | 7/2020 | |
| KR | 10-2021-0037429 A | | 4/2021 | |
| KR | 10-2255793 B1 | | 5/2021 | |

\* cited by examiner

ELECTRONIC DEVICE INCLUDING FLEXIBLE DISPLAY

CROSS-REFERENCE TO RELATED APPLICATIONS

This application is a bypass continuation of International Application No. PCT/KR2022/008150, filed on Jun. 9, 2022, which is based on and claims the benefit of Korean Patent Application No. 10-2021-0086257, filed on Jul. 1, 2021, in the Korean Intellectual Property Office, the disclosures of which are incorporated by reference herein in their entireties.

BACKGROUND

1. Technical Field

The disclosure relate to an electronic device including a flexible display.

2. Description of the Related Art

An electronic device may include a flexible display. For example, the flexible display may be disposed in an electronic device while at least an area thereof is curved, foldable, or rollable. A display area visually exposed to an outer surface of the electronic device may be expanded or contracted.

SUMMARY

The electronic device may sense an expansion level of a flexible display by maintaining a relative location with a magnetic sensor or recognizing an eye of a user who gazes at the display. The scheme utilizing the magnetic sensor may influence another electronic component (e.g., a digitizer) included in the electronic device. Furthermore, the scheme of recognizing an eye of a user may cause an error when a plurality of persons gaze at a screen at the same time.

Provided are an electronic device that may accurately sense an expansion state of a display without being influenced by an external factor (e.g., a magnetic sensor and/or a surrounding environment).

According to an aspect of the disclosure, an electronic device includes: a flexible display that is configured to be deformable to a first state in which an exposed amount of a display area of the flexible display has a first size, and a second state in which the exposed amount of the display area is expanded in a first direction to have a second size that is larger than the first size; a deformable member including a liquid-state electrode, the deformable member being configured to deform in a length direction of the deformable member based on the flexible display transitioning between the first state and the second state; a deformation sensing circuit configured to sense a resistance component of the liquid-state electrode, the resistance component corresponding to an exposure degree of the display area; a connector member electrically connecting the deformable member and the deformation sensing circuit; a rigid member coupled to the deformable member and in which a portion of the connector member is disposed; and a fixed structure contacting a partial area of the rigid member, the fixed structure being configured to press a portion of the deformable member, and configured to restrict movement of the rigid member in a second direction that is opposite to the first direction.

The liquid-state electrode may include: a first electrode area that extends in the second direction; a second electrode area disposed in parallel to the first electrode area, and extending in the second direction; and a third electrode area connecting the first electrode area and the second electrode area, and having a length in a third direction that is substantially perpendicular to the first direction.

A length of the third electrode area may be smaller than a length of the first electrode area and a length of the second electrode area.

The electronic device may further include a circuit board in which the deformation sensing circuit is disposed, and the liquid-state electrode further may include: a first contact area formed from a portion of the first electrode area toward the circuit board; and a second contact area formed from a portion of the second electrode area toward the circuit board.

A side of the liquid-state electrode in the first direction may be adjacent and electrically connected to the connector member, and the liquid-state electrode may extend in the second direction and is deformable in the second direction, and the deformable member may further include a deformable body having a first channel in which the liquid-state electrode is accommodated.

The deformable body may be formed of a first mold and a second mold that are joined together and have different shapes from each other, wherein the first mold is a flat mold, and the second mold has a groove corresponding to the first channel.

A curing agent content of the second mold may be higher than a curing agent content of the first mold.

The fixed structure may include: a first fixed structure configured to press a first surface of the deformable member, the first surface facing the flexible display in a fourth direction; and a second fixed structure configured to press a second surface of the deformable member, the second surface facing in a fifth direction that is opposite to the fourth direction, wherein the first fixed structure overlaps the second fixed structure and the deformable body is interposed between the first fixed structure and the second fixed structure.

The rigid member may surround a side surface of the deformable body, which faces in the first direction.

The deformable body may include: a first fixing boss protruding in a forward direction towards the flexible display; and a second fixing boss protruding in a rearward direction that is opposite to the forward direction.

The rigid member may include: a first stopper step engaged with and coupled to the first fixing boss; and a second stopper step engaged with and coupled to the second fixing boss, wherein at least one of the first stopper step and the second stopper step contacts the fixed structure.

The rigid member may include: a second channel connected to the first channel of the deformable body, and the first contact area and the second contact area may be disposed at a portion of the second channel, and at least a portion of the connector member may be disposed at another portion of the second channel.

The electronic device may further include a panel support part disposed on a rear surface of the flexible display, wherein the deformable member is disposed between the circuit board and the panel support part.

The liquid-state electrode may include galinstan.

The electronic device may further include a display driver configured to transmit a driving signal to the flexible display based on the exposure degree, which is determined by the electronic device based on the deformation sensing circuit sensing the resistance component.

According to an aspect of the disclosure, an electronic device includes: a flexible display that is configured to be deformable to a first state in which an exposed amount of a display area of the flexible display has a first size, and a second state in which the exposed amount of the display area is expanded in a first direction to have a second size that is larger than the first size; a liquid-state electrode configured to deform in a length direction of the liquid-state electrode based on the flexible display transitioning between the first state and the second state; a deformable member including a deformable body accommodating the liquid-state electrode; a deformation sensing circuit configured to sense a resistance component of the liquid-state electrode, the resistance component corresponding to an exposure degree of the display area; a connector member electrically connecting the liquid-state electrode and the deformation sensing circuit; and a fixed structure configured to press a partial area of the deformable body, which is adjacent to the connector member, in a forward direction towards the flexible display and a rearward direction that is opposite to the forward direction such that movement of the connector member with respect to the fixed structure is restricted.

The electronic device may further include a rigid member coupled to the deformable member, wherein at least a partial area of the rigid member contacts the fixed structure, and a portion of the connector member is disposed in an interior of the rigid member.

The deformable body may include: a first fixing boss protruding in the forward direction towards the flexible display; and a second fixing boss protruding in the rearward direction that is opposite to the forward direction.

The rigid member may include: a first stopper step engaged with and coupled to the first fixing boss; and a second stopper step engaged with and coupled to the second fixing boss, and at least one of the first stopper step and the second stopper step may contact the fixed structure.

The electronic device may further include a display driver configured to transmit a driving signal to the flexible display based on the exposure degree, which is determined by the electronic device based on the deformation sensing circuit sensing the resistance component.

The electronic device according to one or more embodiments of the disclosure includes a deformable member including a liquid-state electrode including a liquid-state metal, and thus may accurately detect an expansion state of a flexible display without being influenced by an external factor.

In addition, one or more embodiments of the disclosure may provide various effects that are directly or indirectly recognized from the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
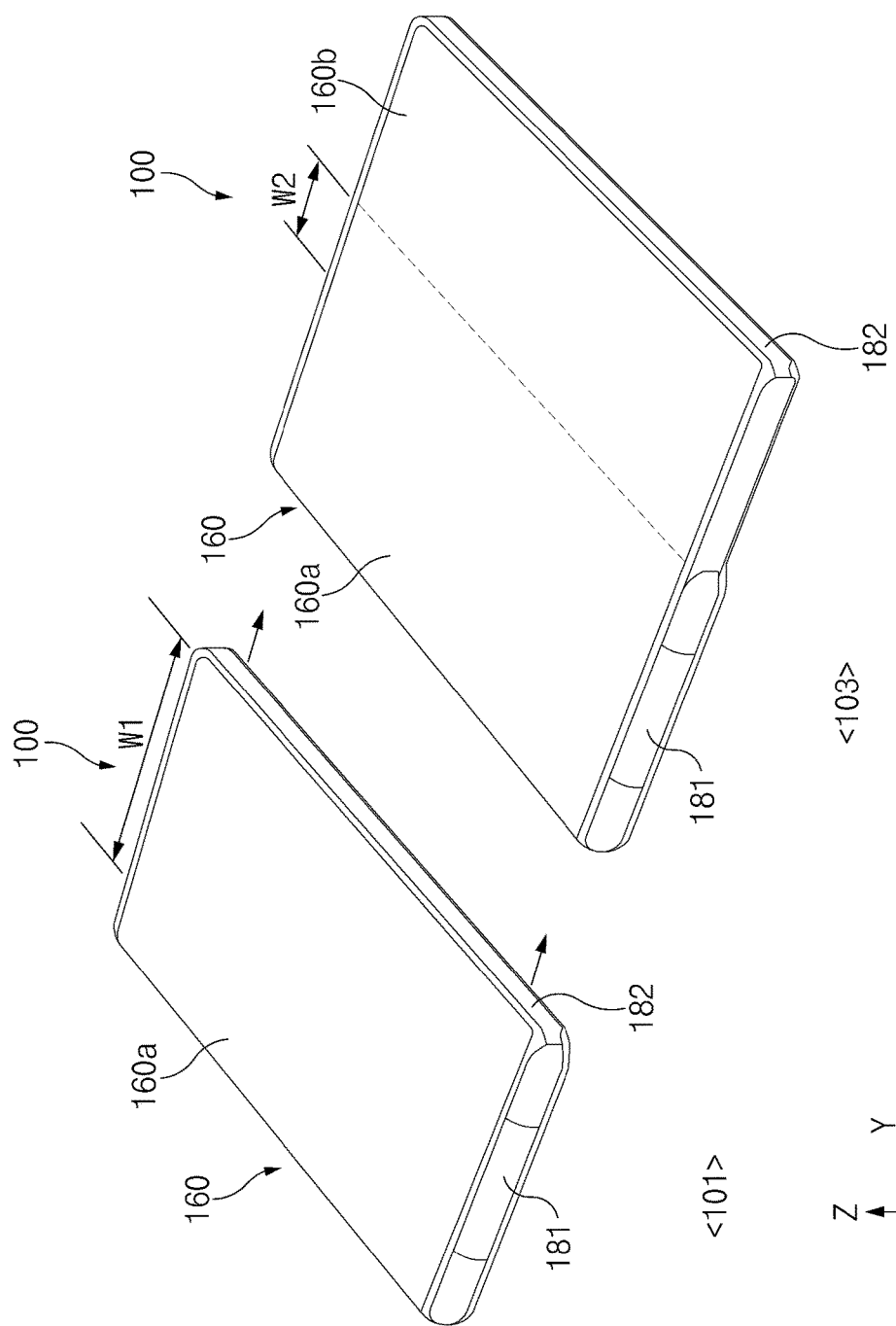
FIG. 1 is a view illustrating an example of an external appearance of an electronic device according to an embodiment.

Hereinafter, various non-limiting example embodiments of the disclosure will be described with reference to the accompanying drawings. Accordingly, those of ordinary skill in the art will recognize that modifications, equivalents, and/or alternatives of the various embodiments described herein can be variously made without departing from the scope and spirit of the disclosure.

With regard to description of drawings, the same or similar components may be marked by the same or similar reference numerals.

FIG. 1 is a view illustrating an example of an external appearance of an electronic device according to an embodiment.

Referring to FIG. 1, an electronic device 100 according to an embodiment may include a display 160 (e.g., a flexible display, of which at least a portion has flexibility), a first housing 181, and a second housing 182. For example, the first housing 181 may function as a fixing cover, to which one side of the display 160 is fixed. The second housing 182 may be moved in a first direction (e.g., the X axis direction) with respect to the first housing 181 or may be moved in a second direction (e.g., the −X axis direction that is opposite to the first direction). As in a first state 101 (or a closed state), when the first housing 181 and the second housing 182 overlap each other with respect to the "Z" axis by a first width W1, a first display area 160*a* of a first size (or a first extent) may be disposed to face an upward direction (e.g., the Z axis direction). Alternatively, in the first state 101, the display 160 may include the first display area 160*a* of the first size, which is visually exposed to an outside. The first housing 181 may be disposed to surround an edge of the first display area 160*a* on one side (e.g., at least a portion of the first display area 160*a* in the second direction (e.g., the −X axis direction), at least a portion of the first display area 160*a* in a third direction (e.g., the Y axis direction), at least a portion of the first display area 160*a* in a fourth direction (e.g., the −Y axis direction), and at least a portion of the first display area 160*a* in a fifth direction (e.g., the −Z axis direction or a direction that is opposite to the Z axis direction), with reference to the illustrated drawings). The display 160 may include the first display area 160*a*, and a second display area 160*b* that extends in the first direction with respect to the first display area 160*a*. In the first state 101, at least a portion of the second display area 160*b*, which extends from the first display area 160*a*, may be disposed to be wounded (or rolled) on or unfolded from an inner side of at least one of the first housing 181 and the second housing 182. In this state, a surface of the first display area 160*a*, from which light from pixels is irradiated, faces a forward direction (e.g., the Z axis direction), and at least a portion of an upper surface of the second display area 160*b*, in which the pixels are disposed, may face a rearward direction (e.g., the −Z axis direction). A portion of the second display area 160*b* may be curved.

According to an embodiment, when the second housing 182 is moved in the first direction (e.g., the X axis direction) with respect to the first housing 181, an exposure area of the display 160 may be expanded. For example, when the first housing 181 and the second housing 182 overlap each other by a second width W2 (e.g., a size that is smaller than the first width W1) in the second state 103 (or an opened state) (e.g., a state, in which the second housing 182 has performed a sliding operation to expand an area of the display 160), the display 160 may include the first display area 160*a* of a first size, which is exposed to an outside (or faces the upward direction (e.g., the Z axis direction)), and the second display area 160*b* of a second size. In the second state 103, the first size of the first display area 160*a* and the second size of the second display area 160*b* may be the same. Alternatively, the first size may be larger than the second size. According to various embodiments, the second size may vary according to a sliding distance or a movement distance of the second housing 182.

According to an embodiment, the display 160 may maintain a state (e.g., the closed state), in which a portion thereof is wound, in the first state 101, and may have a state (e.g., the opened state), in which at least a portion thereof is unfolded in the wound state, in the second state 103. The second housing 182 may be disposed to surround at least a portion of the second display area 160*b* in the first direction (e.g., the X axis direction), at least a portion of the second display area 160*b* in a third direction (e.g., the Y axis direction), at least a portion of the second display area 160*b* in a fourth direction (e.g., the −Y axis direction), and at least a portion of the second display area 160*b* in a fifth direction (e.g., the −Z axis direction or a direction that is opposite to the Z axis direction). According to various embodiments, at least a portion of the second housing 182 may be connected to an inner side of the first housing 181, and may be slid in any one of the first direction (e.g., the X axis direction) and the second direction (e.g., the −X axis direction) along an inner surface of the first housing 181. While the first housing 181 and the second housing 182 are slid, the first housing 181 and the second housing 182 may be disposed to surround an edge of the display 160. Various electronic elements related to driving of the display 160, electronic elements related to various user functions supported by the electronic device 100, or batteries may be disposed on inner sides of the first housing 181 and the second housing 182.

According to an embodiment, the electronic device 100 may include a sliding structure based on an elastic structure, which is related to the display 160. For example, when the display 160 is moved by a preset distance by an external force, the display 160 may be changed from the first state (closed state) 101 to the second state (opened state) 103, or from the second state 103 to the first state 101 without any further external force, due to the elastic structure.

Figure 2:
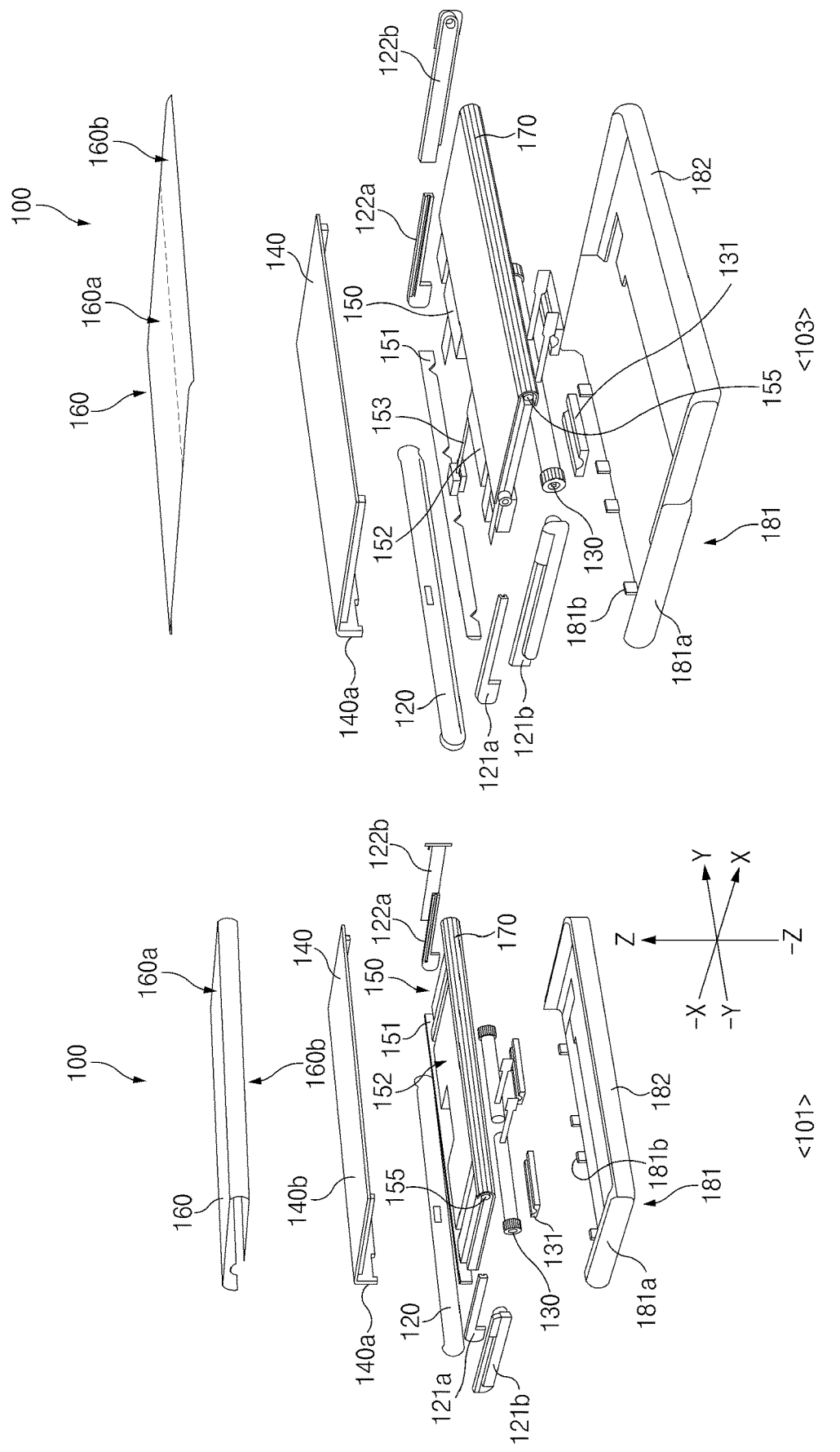
FIG. 2 is an exploded perspective view of configurations of the electronic device of FIG. 1.
Figure 3:
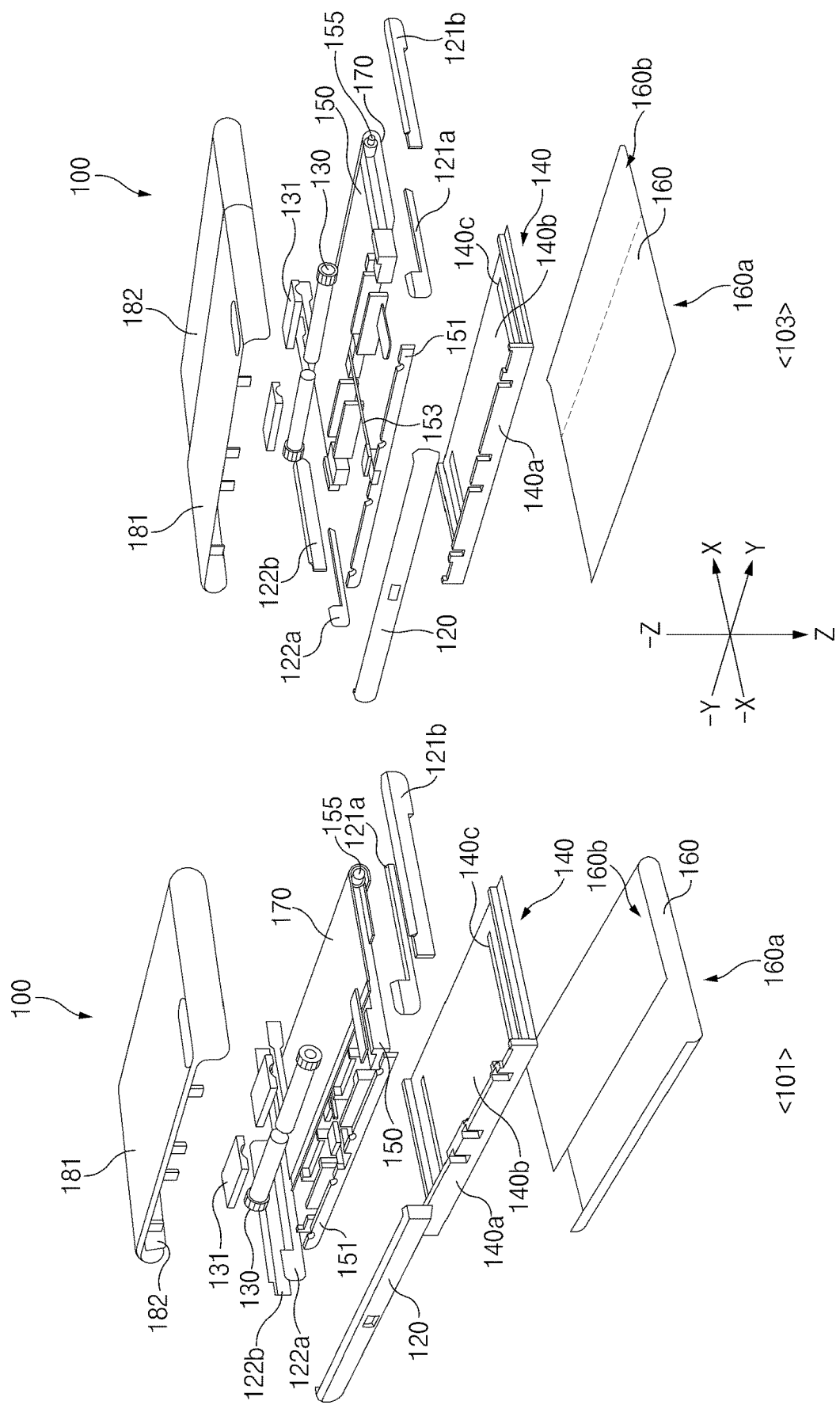
FIG. 3 is an exploded perspective view of the configurations of the electronic device of FIG. 1, with respect to a direction that is different from that of FIG. 2.

FIG. 2 is an exploded perspective view of configurations of the electronic device of FIG. 1. FIG. 3 is an exploded perspective view of the configurations of the electronic device of FIG. 1, with respect to a direction that is different from that of FIG. 2.

For example, FIG. 2 is a view illustrating a structure, in which the display 160 is disposed on the first housing 181 or the second housing 182 from a fifth direction (e.g., the −Z axis direction) to a sixth direction (e.g., the Z axis direction), and FIG. 3 is a view illustrating a structure, in which the first housing 181 or the second housing 182 and the display 160 are disposed in an direction that is opposite to that of FIG. 2.

Referring to FIGS. 2 and 3, the electronic device 100 according to an embodiment may include the display 160, a first display support member 140, a sliding structure 150, a first sliding support member 121*a*, a first sliding member 121*b*, a second sliding support member 122*a*, a second sliding member 122*b*, an actuator 130, an actuator support member 131, the first housing 181, and/or the second housing 182.

According to an embodiment, a plurality of pixels are disposed in a matrix form in the display 160, and at least some of the pixels may be provided in a flexible form. As an example, the display 160 may include a panel layer, in which the plurality of pixels are disposed and a screen is displayed, and an external protection layer disposed on the panel layer. The panel layer, for example, may include a light emitting layer including a plurality of pixels that are implemented by light emitting elements, such as organic light emitting diodes (OLEDs) or micro LEDs (light emitting diodes), and other various layers (e.g., optical layers for improving a quality of a screen or improving an outdoor visibility, such as polarization layers). According to an embodiment, when viewed from the −Z axis direction, a plurality of pixels may not be disposed in a partial area of the display 160, which at least partially overlaps at least one electronic component (e.g., the camera module or the sensor module) included in the electronic device 100. The external protection layer may include various layers for functioning to support and protect the panel layer (e.g., functioning as a cushion), functioning to shield light, functioning to absorb or shield electromagnetic waves, or functioning to disperse, diffuse, or dissipate heat. At least a portion of the external protection layer may be formed of a polymer structure (e.g., polyimide (PI) or polyester (PET)) or glass. Additionally, the display 160 may further include a touch panel layer. The touch panel layer may include a touch display driver IC (TDDI) disposed in a chip on panel (COP) or chip on film (COF) scheme. The display 160, as described with reference to FIG. 1, may include the first display area 160*a* and the second display area 160*b*. At least a portion of the second display area 160*b* may be disposed to be wound on an inner side of the second housing 182 in the first state 101 (or the closed state), and may be visually exposed to an outer side of the second housing 182 in the second state 103. While at least a portion of the second display area 160*b* is wound and is curved with respect to a first rotary shaft 155 (or a rolling gear part or a rotary shaft member), the remaining portions of the second display area 160*b* may be disposed on a rear surface of the first display area 160*a*.

According to an embodiment, one side (e.g., at least a portion of the second display area 160*b*) of the display 160 may be held on an inner side of at least one of the first housing 181 and the second housing 182. In this state, one end of the display 160 disposed on an inner side of the electronic device 100 may be coupled to an elastic member. For example, while the second display area 160*b* of the display 160 is visually exposed to an outside, an elastic force by the elastic member may be applied to the display 160 as a tension and a repulsive force in a curved section of the display 160 may be offset. Accordingly, a wound portion of the display 160 may be maintained uniformly.

According to an embodiment, the first display support member 140 may support the display 160 while having a specific strength. For example, at least a portion of the first display support member 140 may be formed of aluminum or an aluminum alloy, and at least a portion of a surface of the first display support member 140, which faces the display 160, may be substantially flat. As an example, at least a portion of the first display support member 140 may be formed of an injection-molded product (e.g., a structure including magnesium). In the first state 101, a first surface (e.g., a surface that faces in the −Z axis direction) of the first display support member 140 may face a rear surface (e.g., a surface that faces the −Z axis direction) of the first display area 160*a*, and a second surface (e.g., a surface that faces in the −Z axis direction) of the first display support member 140 may face an upper surface (e.g., a surface that faces in the Z axis direction) of the sliding structure 150.

According to an embodiment, the first display support member 140 has a side wall 140*a* on one side thereof, and may include a flat area 140*b* that supports at least a portion of the display 160 while being perpendicular to the side wall 140*a*. Accordingly, the first display support member 140 may have an "L"-shaped cross-section. The side wall 140*a* may be coupled to at least one of a guard member 120 of the first housing 181 and a fixing part 151 of the sliding structure 150. According to various embodiments, additional side walls for supporting the first sliding member 121*b* and the second sliding member 122*b* may be disposed at opposite edges (e.g., that are adjacent to a plurality of the side wall 140*a*) of the first display support member 140, respectively.

According to an embodiment, at least one guide rail 140*c* may be formed on a second surface (e.g., a surface facing in the −Z axis direction) of the first display support member 140. The guide rail 140*c* may be a groove that has a specific length, on a rear surface of the first display support member 140. At least a portion of the first sliding support member 121*a* and the second sliding support member 122*a* may be seated on the guide rail 140*c*.

According to an embodiment, at least a portion of the sliding structure 150 may be coupled to the second housing 182, and may be slid according to the sliding operation of the second housing 182. Alternatively, the sliding structure 150 may be moved by the actuator 130.

According to an embodiment, when a signal is generated through an input device included in the electronic device 100, the electronic device 100 may be changed from the first state 101 to the second state 103 or from the second state 103 to the first state 101 due to a driving device (e.g., the actuator 130 or a motor) connected to the display 160. For example, a separate physical button (e.g., a hardware button) that may instruct driving of the actuator may be disposed in the electronic device 100 or a menu (e.g., a software button) related to driving of the actuator may be output on a display screen of the display 160, and when a signal is generated based in a user input, the electronic device 100 may be changed from the first state 101 to the second state 103 or from the second state 103 to the first state 101.

According to an embodiment, a signal is generated by the sensor module included in the electronic device 100, the electronic device 100 may be changed from the first state 101 to the second state 103, or from the second state 103 to the first state 101. For example, when the electronic device 100 is carried or gripped by a hand, a squeeze gesture of pressing a specific section of the electronic device 100 by a portion (e.g., a palm or a finger) of a hand may be sensed through a sensor, and in correspondence, the electronic device 100 may be changed from the first state 101 to the second state 103, or from the second state 103 to the first state 101.

Accordingly, while the second housing 182 is moved in the first direction (e.g., the X axis direction), at least a portion of the sliding structure 150 is moved in the first direction (e.g., the X axis direction), and a disposition direction of the second display area 160*b* of the display 160 fixed to the sliding structure 150 may be at least partially changed from the fifth direction (e.g., the −Z axis direction) to the sixth direction (e.g., the Z axis direction).

According to an embodiment, the sliding structure 150 may include the fixing part 151, a second display support member 152, a panel support part 170 (or a multi-bar), the first rotary shaft 155, and/or a connector 153. For example, the fixing part 151 may be formed while having a specific length (e.g., a length corresponding to a long axis of the side wall 140*a* of the first display support member 140) in the third direction (e.g., the Y axis direction). The fixing part 151 may be disposed substantially in parallel to the guard member 120 of the first housing 181. Furthermore, the fixing part 151 may be disposed substantially in parallel to the side wall 140*a* of the first display support member 140. At least a portion of the fixing part 151 may be coupled to at least one of the guard member 120 and the side wall 140*a*. In this regard, at least one hole that passes through front and rear surfaces (e.g., from the X axis direction to the −X axis direction) may be disposed on one side of the fixing part 151.

According to an embodiment, the second display support member 152 may be disposed such that the upper surface (e.g., a surface facing in the Z axis direction) thereof faces the lower surface (e.g., a surface facing in the −Z axis direction) of the first display support member 140 in the first state 101. The lower surface (e.g., a surface facing in the −Z axis direction) of the second display support member 152 may be disposed to face at least a portion of an inner side of the first housing 181 or an inner side of the second housing 182. At least one hardware element (e.g., the printed circuit board, the processor, or the battery) related to driving of the electronic device 100 may be disposed on an inner side of the second display support member 152. The second display support member 152 may be moved together with the second housing 182 as the second housing 182 is moved. While the second display support member 152 is moved in the first direction (e.g., the X axis direction), at least a portion of the panel support part 170 may be moved to an upper surface (e.g., a surface facing in the Z axis direction) of the second display support member 152 from a state, in which it is disposed on a lower surface (e.g., a surface facing in the −Z axis direction) of the second display support member 152.

According to an embodiment, the panel support part 170 may have a multi-bar shape, in which a plurality of bosses (or columns, long bars, or slates) having a specific length in the third direction (e.g., the Y axis direction) are disposed at a specific interval. At least a portion of the panel support part 170 may form a locus and a portion (e.g., the second display area 160*b*) of the display disposed on the locus may be moved (or slid). One side lengths of the protrusions may correspond to one side length of the display 160. The panel support part 170 may be disposed to surround at least a portion of the second display support member 152. Surfaces of the plurality of bosses constituting the panel support part 170, which face the rear surface of the display 160, may be flat, and a portion (e.g., a portion that faces the first rotary shaft 155) disposed to face an inner side of the sliding structure 150 may protrude. For example, a lower surface (e.g., surfaces of the bosses, which face the sliding structure 150) of the panel support part 170 may have ridges and valleys of a gear, which are repeatedly formed. According to the sliding operation, among the plurality of bosses constituting the panel support part 170, the bosses disposed on the upper surface of the second display support member 152 may be disposed to be continuous to the adjacent other bosses, and may form a flat surface. Among the bosses constituting the panel support part 170, the bosses disposed at locations that face the first rotary shaft 155 may be disposed to be spaced apart from the adjacent bosses at a specific interval. The panel support part 170 may include a connection chain or a connection shaft that connects the plurality of bosses. At least one of the plurality of bosses may be formed of a material (e.g., a magnetic body (an object that forms an attractive force through a reaction with a magnetic force) or a magnet) that has a magnetic force.

According to an embodiment, the panel support part 170 may include a lattice structure in an area that at least partially overlaps an area (e.g., the second display area 160*b*), in which the display 160 is disposed to be curved. For example, the lattice structure may include a plurality of openings or a plurality of slits, and may contribute to a deflection property of the display 160. According to various embodiments, the panel support part 170 may include a recess pattern including a plurality of recesses, in replacement of the lattice structure, and the recess pattern may contribute to the deflection property of the display 160. According to an embodiment, the lattice structure or the recess pattern may be expanded to at least a portion of the first display area 160*a*. According to an embodiment, the panel support part 170 including the lattice structure or the recess pattern or a conductive member corresponding thereto may have a plurality of layers.

According to an embodiment, the first rotary shaft 155 (or a rolling gear part or a rotary shaft member) may have a length that is similar to one side length of the second display support member 152, and may be disposed at an edge of one side of the second display support member 152 substantially in parallel thereto. For example, the first rotary shaft 155 may have a cylindrical rod shape. Centers of opposite side surfaces of the first rotary shaft 155 may protrude further from surroundings. Central portions of the opposite side surfaces of the protruding first rotary shaft 155 may be held on one side of the second housing 182. Accordingly, the first rotary shaft 155 may be rotated while the second housing 182 is moved in the first direction (e.g., the X axis direction). At least a portion of the first rotary shaft 155 may be gear-coupled to the panel support part 170. Alternatively, the first rotary shaft 155 may contact at least a portion of the panel support part 170. While the first rotary shaft 155 is rotated, a disposition form of the panel support part 170 may be changed. For example, while the first rotary shaft 155 is rotated in the first rotational direction, at least a portion of the panel support part 170 may be moved to the upper surface (e.g., the surface facing in the Z axis direction) of the second display support member 152. While the first rotary shaft 155 is rotated in the second rotational direction, at least a portion of the panel support part 170 may be moved to the lower surface (or between the second display support member 152 and the second housing 182) of the second display support member 152.

According to an embodiment, the connector 153 may connect the fixing part 151 and the second display support member 152. In this regard, one side of the connector 153 may be fixed to a specific location (e.g., a center of the fixing part 151) of the fixing part 151, and an opposite side thereof may be coupled to the lower surface (e.g., the surface facing in the −Z axis direction) of the second display support member 152. The connector 153 may include a gear pattern having at least one ridge and at least one valley. According to various embodiments, the connector 153 may be implemented in a form of a rack. The second display support member 152 may be moved in the first direction (e.g., the X axis direction) or the second direction (e.g., the −X axis direction) while being coupled to the connector 153.

According to an embodiment, the first sliding support member 121*a* may be held on one side of the first display support member 140, and may be coupled to the first sliding member 121*b* such that the first sliding member 121*b* is moved. In this regard, the first sliding support member 121*a* may include a support part disposed substantially in parallel to one side (e.g., a side surface observed from the −Y axis direction) of the second display support member 152, and a protruding part protruding from the support part and at least a portion of which is coupled to the first sliding member 121*b*.

According to an embodiment, at least a portion of the first sliding member 121*b* may be coupled to the first sliding support member 121*a* seated on the guide rail 140*c*, and the first sliding member 121*b* may be coupled to the second display support member 152. For example, the first sliding member 121*b* may be formed such that at least a portion thereof corresponds to a shape of one side (e.g., a side surface facing in the −Y axis direction) of the second display support member 152.

According to an embodiment, the second sliding support member 122*a* may have the same shape as that of the first sliding support member 121*a*, and may be disposed to be spaced apart from the first sliding support member 121*a*. For example, the second sliding support member 122*a* may be disposed at a location that is opposite to the first sliding support member 121*a* with respect to the sliding structure 150. At least a portion of the second sliding support member 122*a* may be seated on the guide rail 140*c* formed in the first display support member 140, and the second sliding support member 122*a* may be coupled to the second sliding member 122*b*.

According to an embodiment, the second sliding member 122*b* may be coupled to the second sliding support member 122*a*, and may be coupled to the second display support member 152. For example, the second sliding member 122b may be disposed at a location that is opposite to the first sliding member 121b with respect to the sliding structure 150.

According to an embodiment, the actuator 130 may receive electric power from a battery included in the electronic device 100 and generate power. A pinion gear may be disposed on one side of the actuator 130, and the pinion gear may be geared on a rack formed on one side of the sliding structure 150. According to the operations of the actuator 130, the actuator 130 may be operated to be disposed close to the guard member 120 in the first state 101, and may be operated to be moved in a direction (or in a direction of the second housing 182) that becomes farther away from the guard member 120 in the second state 103. At least one actuator 130 may be disposed long in a lengthwise direction (e.g., the Y axis direction or the −Y axis direction) of the sliding structure 150. In the illustrated drawings, a form, in which two actuators are disposed on the same axis, is exemplified. As another embodiment, the electronic device 100 may not include the actuator 130, and the second housing 182 may be moved by an external force (e.g., a force of a user).

According to an embodiment, the actuator support member 131 may support one side of a body of the actuator 130. The actuator support member 131 may be moved together with the actuator 130 as the actuator 130 is moved.

According to an embodiment, the first housing 181 may include a cover base 181a including a bottom surface, on which at least a portion of the sliding structure 150 is seated, and disposed to surround edges (side parts disposed at ends in the Y axis direction and the −Y axis direction) of the sliding structure 150, the guard member 120 that fixes the first display support member 140 and the fixing part 151 in a state, in which the side wall 140a of the first display support member 140 and the fixing part 151 are disposed, and a coupling part 181b that couples the guard member 120. The coupling part 181b may be disposed in the second direction (e.g., the −X axis direction) of the first housing 181, and at least a portion of the first housing 181 in the second direction (e.g., the −X axis direction) may be closed while the guard member 120 is coupled to the coupling part 181b. The first direction (e.g., the X axis direction) of the first housing 181 is opened, and the second housing 182 may be coupled through the first direction (e.g., the X axis direction).

According to an embodiment, the second housing 182 may be coupled to the first housing 181 in the first direction (e.g., the X axis direction). The second housing 182 may include a bottom surface, on which at least a portion of the sliding structure 150 is seated, and side walls (e.g., side walls disposed in the X axis direction, the Y axis direction, and the −Y axis direction) that surround side surfaces of the sliding structure 150. The second housing 182 may be moved in the first direction (e.g., the X axis direction) or the second direction (e.g., the −X axis direction) while the sliding structure 150 is seated thereon. Then, a disposition form and a location of the second housing 182 may be changed according to an operation of the actuator 130. Furthermore, the disposition form and the location of the second housing 182 may be changed through an external force by a user.

In the above description, the structure, in which various configurations of the electronic device 100 are disposed, has been described, but embodiments of the disclosure are not limited thereto. For example, the electronic device 100 according to an embodiment of the disclosure may include the display, the first housing that surrounds one side of the display, the panel support part disposed on one side of the display, the rotary shaft that contacts the panel support part, and the second housing coupled to the first housing and the rotary shaft, and the other configurations may be added or excluded. The above-described electronic device 100 may include the actuator, and may be operated such that the second display area 160b is automatically expanded or contracted under the control of the actuator. Alternatively, according to the electronic device, while the second housing 182 is moved in the first direction (e.g., the X axis direction) by an external force applied to the second housing 182, the sliding structure 150 and the first rotary shaft 155 engaged with the second housing 182 may be rotated such that the second display area 160b may be expanded or contracted in a manual scheme. Alternatively, the first rotary shaft 155 may be disposed in the first housing 181 and the display 160 may be fixed to the second housing 182 so that a partial area of the display 160 accommodated in the first housing 181 may be expanded or contacted as the second housing 182 is moved, in the electronic device 100.

The electronic device 100 according to the embodiment having the above-described structure may include a deformable member that may detect a change level of an exposure area of the display 160 as a partial area of the display 160 is expanded and contracted. A resistance component of the deformable member may be changed as the screen of the display 160 is expanded and contracted.

Figure 4:
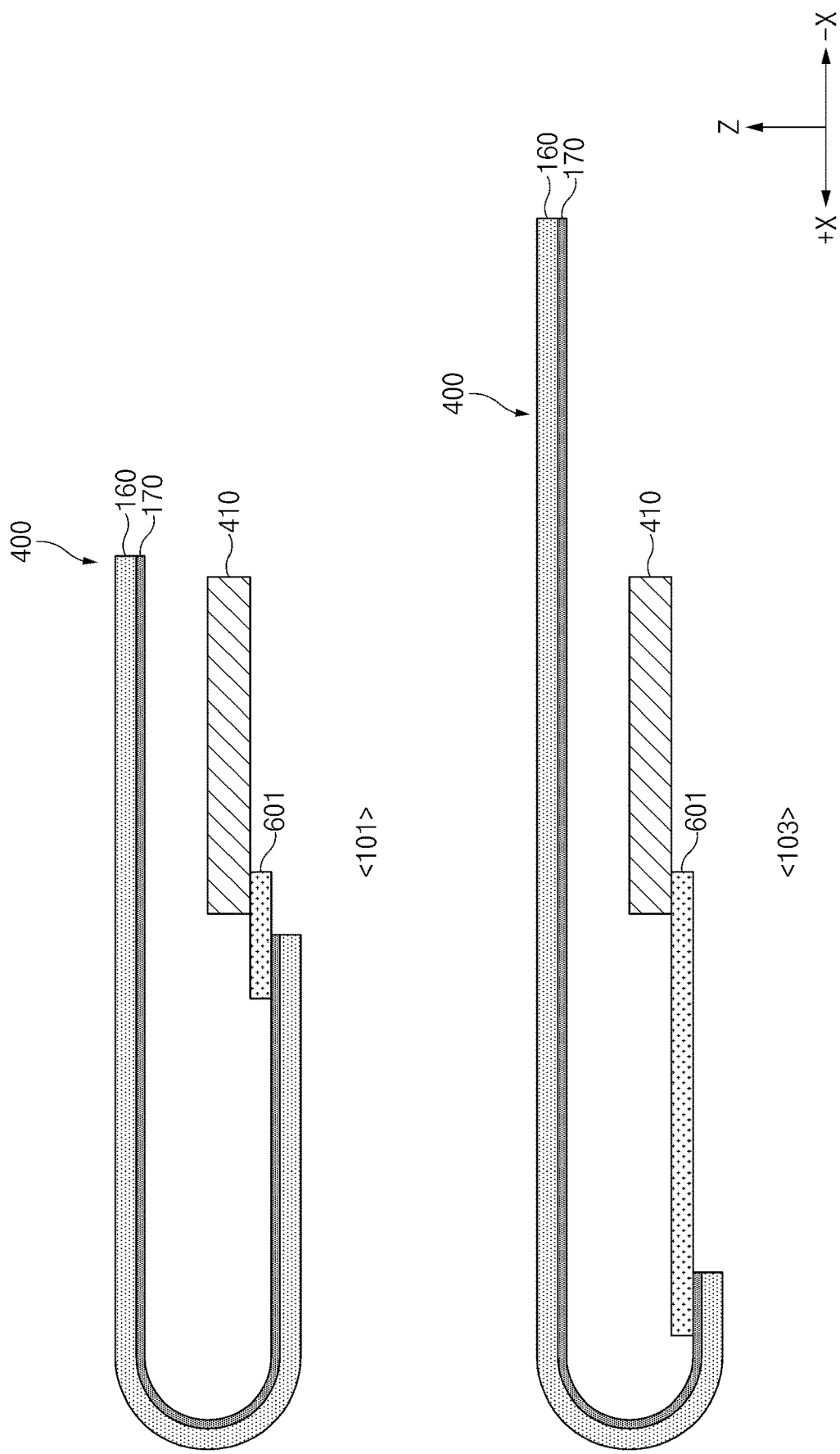
FIG. 4 is a view illustrating an electronic device including a deformable member that is deformed to a first state and a second state according to an embodiment.

FIG. 4 illustrates views illustrating the first state 101 and the second state 103 of the display of the electronic device according to various embodiments.

Referring to FIG. 4, an electronic device 400 according to various embodiments may include the display 160, the panel support part 170, a deformable member 601, and a circuit board 410. At least any one of the elements of the electronic device 400 illustrated in FIG. 4 may be the same as or similar to at least one of the elements of FIGS. 1, 2 and 3, and thus a repeated description thereof will be omitted.

The deformable member 601 may be disposed between the panel support part 170 and the circuit board 410. One side of the deformable member 601 may be coupled to the panel support part 170. One side of the deformable member 601 may be coupled to the panel support part 170 through a bonding scheme using a bonding tape or a mechanical scheme using a mechanism such as a screw.

An opposite side of the deformable member 601 may be fixed to the circuit board 410 or the fixed structure (e.g., a fixed structure 830 of FIG. 8 or a fixed structure 930 of FIG. 9, which will be described below). Hereinafter, a structure, in which the opposite side of the deformable member 601 is fixed to the circuit board 410, will be described as an example. However, embodiments of the disclosure are not limited thereto.

A length of the deformable member 601 may be changed along the panel support part 170 that is operated when the second display area (e.g., the second display area 160b of FIG. 1) of the display 160 is expanded and contracted. When the second display area of the display 160 is expanded to any one of the first direction (e.g., the +X axis direction) and the second direction (e.g., the −X axis direction) as the panel support part 170 is moved, the deformable member 601 may be prolonged in the other one of the first direction and the second direction, which is an opposite direction to the expansion direction while being fixed to the circuit board 410. Because the second display area of the display 160 is expanded when the electronic device 400 is changed from the first state 101 to the second state 103, the length of the deformable member 601 may be increased. When the second display area of the display 160 is maximally expanded, the length of the deformable member 601 may be maximally expanded. When the second display area of the display 160 is contracted as the panel support part 170 is moved, the deformable member 601 may be contracted in the first direction while being fixed to the circuit board 410. Because the second display area of the display 160 is contracted when the electronic device 400 is changed from the second state 103 to the first state 101, the length of the deformable member 601 may be decreased to a minimum length or an initial length.

According to an embodiment, when the electronic device 400 is changed from the second state 103 to the first state 101, the deformable member 601 may function as a tension belt because it is formed of an elastic material. When the electronic device 400 is changed from the second state 103 to the first state 101, the deformable member 601 contracted in the first direction may easily pull the display 160 coupled to the panel support part 170.

Because the length of the deformable member 601 is changed according to an expansion degree of the second display area of the display 160, the resistance value of the deformable member 601 may be changed. For example, because the deformable member 601 is prolonged when a partial area of the display 160 is expanded, the resistance value of the deformable member 601 may become larger than the initial resistance value. Because the deformable member 601 is contracted when the display 160, a partial area of which has been expanded, is restored to the initial state, the resistance value of the deformable member 601 may be restored to the initial resistance value.

A deformation sensing circuit (e.g., a deformation sensing circuit 1332 of FIG. 13, which will be described below) may be disposed on the circuit board 410. The deformation sensing circuit may sense an expansion level of the display 160 by sensing a change of the resistance of the deformable member 601. The deformation sensing circuit may sense an expansion level of the display 160 by sensing a change of the resistance of the deformable member 601. The deformation sensing circuit may sense an increased exposure area of the display 160 when the resistance value of the deformable member 601 is increased. The deformation sensing circuit may sense a decreased exposure area of the display 160 when the resistance value of the deformable member 601 is decreased. According to an embodiment, the circuit board 410 may be a printed circuit board (PCB).

According to an embodiment, when the display 160 is expanded in the second direction (e.g., the −X axis direction), the deformable member 601 may be elongated in the first direction (e.g., the +X axis direction) that is an opposite direction to the second direction while being fixed to the circuit board 410 as illustrated in FIG. 4. According to another embodiment, when the display 160 is expanded in the second direction (e.g., the −X axis direction), the deformable member 601 may be elongated in the first direction (e.g., the +X axis direction) that is an opposite direction to the second direction while being fixed to the circuit board 410 as illustrated in FIG. 4. According to another embodiment, when the display 160 is expanded in the first direction (e.g., the +X axis direction) and the second direction (e.g., the −X axis direction), the deformable member 601 may be elongated in the first direction (e.g., the +X axis direction) and the second direction (e.g., the −X axis direction) while being fixed to the circuit board 410. Hereinafter, embodiments, in which the deformable member 601 is elongated in the second direction that is an opposite direction to the first direction, which is the expansion direction of the display 160, by the deformable member 601, will be described as an example with reference to FIGS. 5 to 15.

Figure 5:
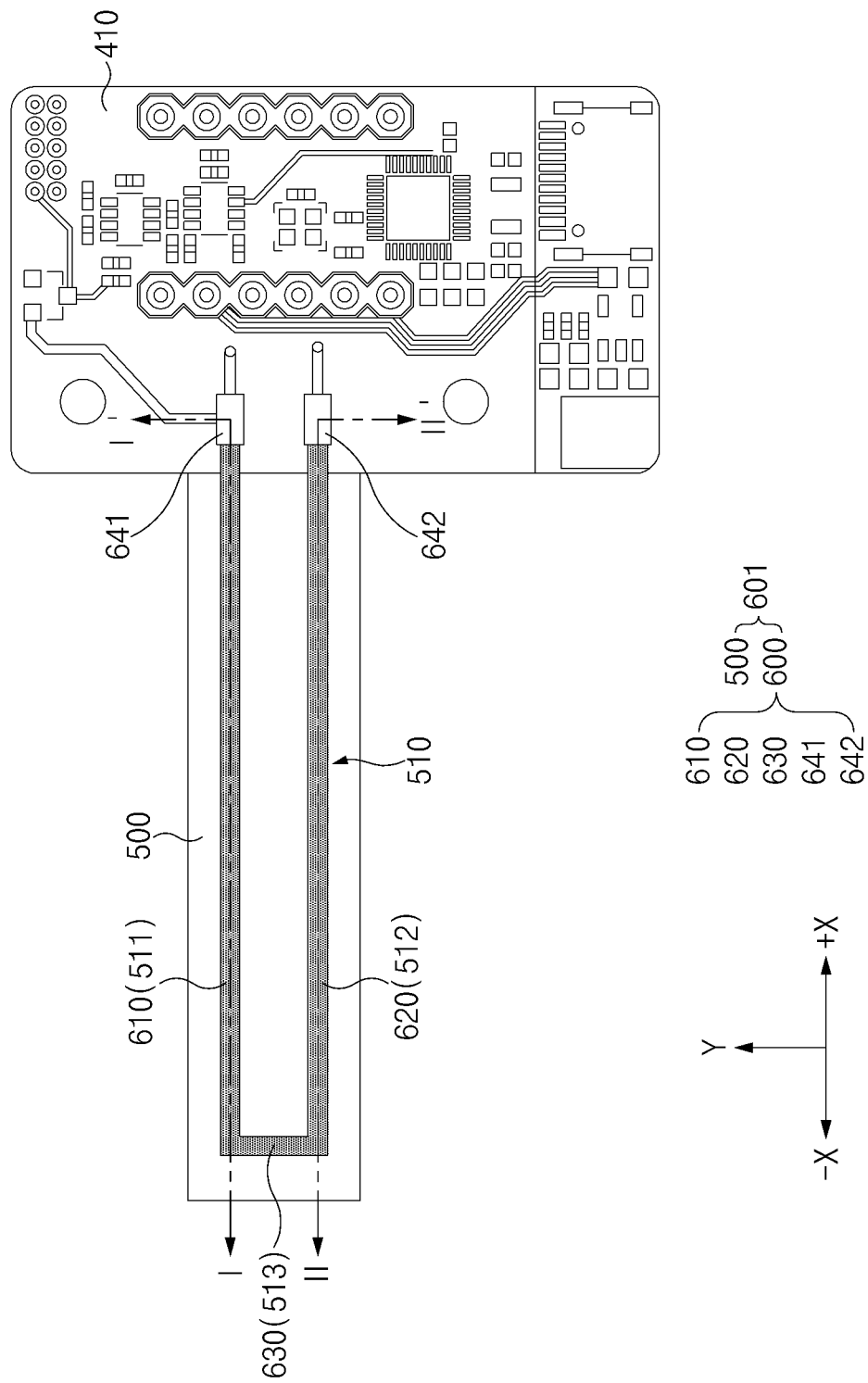
FIG. 5 is a view illustrating a disposition relationship between the deformable member illustrated in FIG. 4 and a circuit board.
Figure 6A:
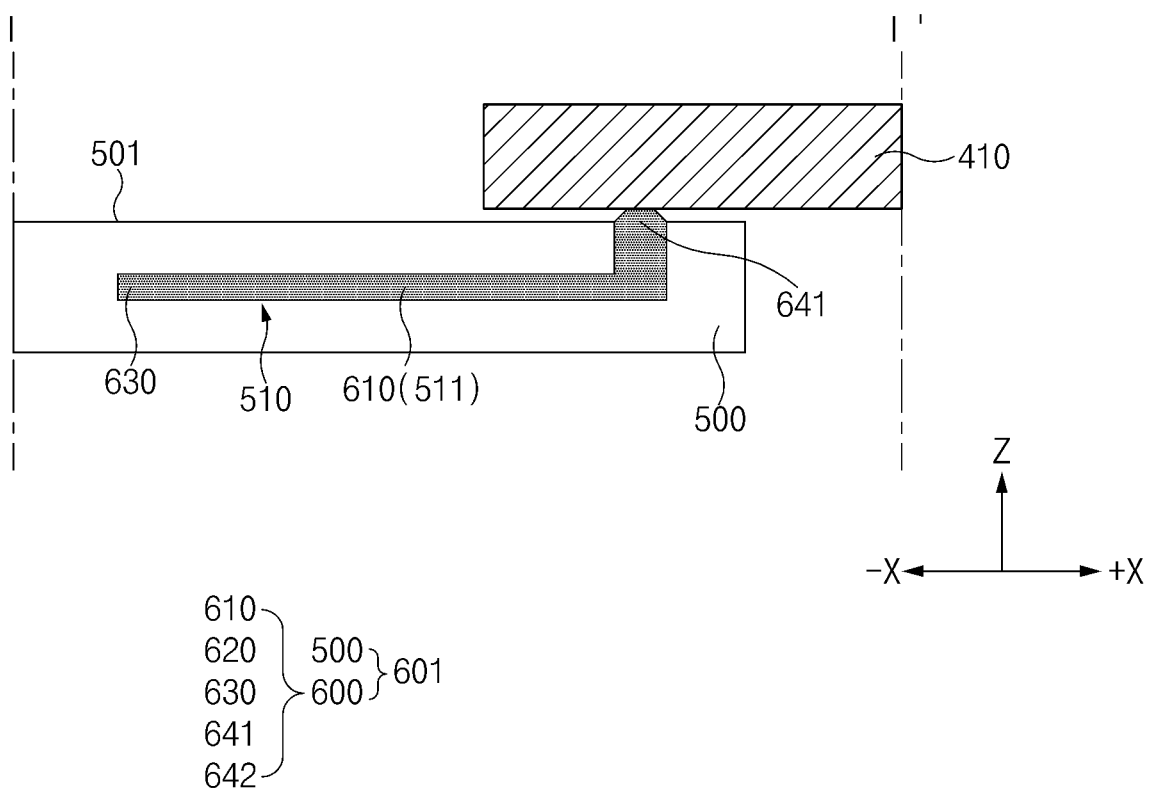
FIG. 6A is a view taken along line I-I' in FIG. 5.
Figure 6B:
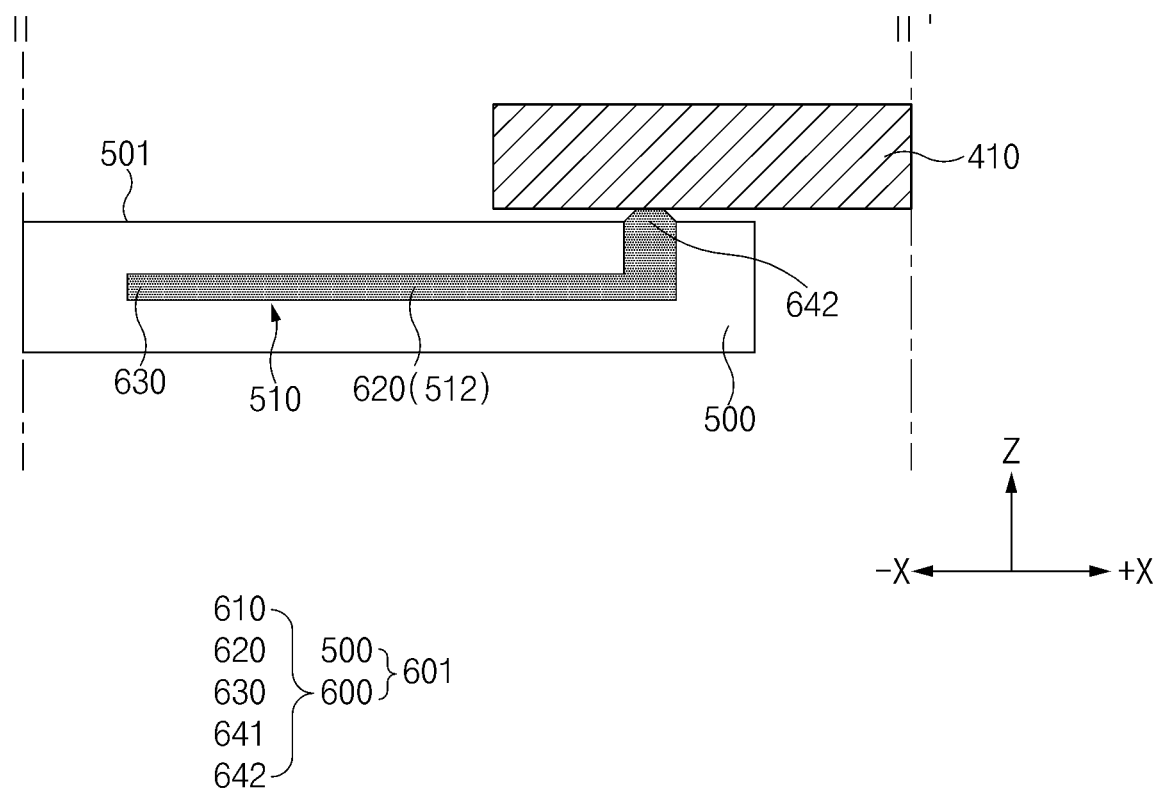
FIG. 6B is a view taken along line II-IF in FIG. 5.

FIG. 5 is a plan view illustrating the deformable member connected to the circuit board of the electronic device according to various embodiments. FIG. 6A is a view taken along line I-I' in FIG. 5 and FIG. 6B is a view taken along line II-IF in FIG. 5. At least any one of the elements of the electronic device 400 illustrated in FIG. 5, FIG. 6A, and FIG. 6B may be the same as or similar to at least one of the elements of FIGS. 1 to 4, and thus a repeated description thereof will be omitted.

Referring to FIGS. 5 to 6B, the deformable member 601 according to various embodiments may include a deformable body 500 and a liquid-state electrode 600.

The deformable body 500 may be smoothly changed according to a change in an exposure area of the display 160. Because the deformable body 500 is formed of a polymer material such as rubber or silicon, it may have an elongation rate of 50% or more. According to an embodiment, the deformable body 500 may be formed of an elastic polymer having a high flexibility. For example, the deformable body 500 may be formed of polydimethylsiloane (PDMS). The deformable body 500 may include at least one first channel 510 in the interior thereof. The first channel 510 of the deformable body 500 may be filed with the liquid-state electrode 600.

The first channel 510 of the deformable body 500 may include a first channel area 511, a second channel area 512, and a third channel area 513. At least any one of the first channel area 511 and the second channel area 512 may be parallel to the expansion direction (e.g., the +X axis direction) of the display 160. For example, the first channel area 511 and the second channel area 512 may be parallel to the expansion direction (e.g., the +X axis direction) of the display 160. A length of at least any one of the first channel area 511 and the second channel area 512 that are parallel to the expansion direction (e.g., the +X axis direction) of the display 160 may be larger than that of the third channel area 513. The third channel area 513 may be disposed between the first channel area 511 and the second channel area 512 to connect the first channel area 511 and the second channel area 512. The third channel area 513 may be disposed to cross the expansion direction (e.g., the X axis direction) of the display 160. For example, the third channel area 513 may be disposed to be perpendicular to the expansion direction (e.g., the X axis direction) of the display 160.

The liquid-state electrode 600 may be a room-temperature liquid-state metal having a low melting point and a high boiling point. For example, the liquid-state electrode 600 may be galinstan that is an alloy including gallium, indium, and tin. The first channel 510 of the deformable body 500 may be filled with the liquid-state electrode 600. The liquid-state electrode 600 may include a first electrode area 610, a second electrode area 620, a third electrode area 630, a first contact area 641, and a second contact area 642.

The first channel area 511, that is parallel to the expansion direction (e.g., the X axis direction) of the display 160, may be filled with the first electrode area 610. A length of the first electrode area 610 may be changed according to an extent of the display 160, exposed to an outside. For example, the length of the first electrode area 610 may be increased as the extent of the display 160 exposed to the outside is increased. One side of the first electrode area 610 may be electrically connected to the third electrode area 630. An opposite side (a side that faces in the +X axis direction) of the first electrode area 610 may be electrically connected to the circuit board 410 through the first contact area 641.

The first contact area 641 may extend from the first electrode area 610 toward the circuit board 410. At least a portion of the first contact area 641 may protrude toward the circuit board 410 further than a first surface 501 of the deformable body 500 that faces the circuit board 410 to be directly connected to the circuit board 410. For example, a portion of the first contact area 641, which extends from the first electrode area 610, may be within the first channel 510, and the remaining portions of the first contact area 641 may protrude toward the circuit board 410 further than the deformable body 500 to be directly connected to the circuit board 410.

The second electrode area 620 may be disposed to be spaced apart from the first electrode area 610. The second channel area 512, that is parallel to the expansion direction (e.g., the +X axis direction) of the display 160, may be filled with the second electrode area 620. A length of the second electrode area 620 may be changed according to an extent of the display 160, exposed to an outside. For example, the length of the second electrode area 620 may be increased as the extent of the display 160 exposed to the outside is increased. One side (e.g., a side that faces in the −X axis direction) of the second electrode area 620 may be electrically connected to the third electrode area 630. An opposite side (e.g., a side that faces in the +X axis direction) of the second electrode area 620 may be electrically connected to the circuit board 410 through the second contact area 642.

The second contact area 642 may be disposed to be spaced apart from the first contact area 641. The second contact area 642 may extend from the second electrode area 620 toward the circuit board 410. At least a portion of the second contact area 642 may protrude toward the circuit board 410 further than the first surface 501 of the deformable body 500 that faces the circuit board 410 to be directly connected to the circuit board 410. For example, a portion of the second contact area 642, which extends from the second electrode area 620, may be within the first channel 510, and the remaining portions of the second contact area 642 may protrude toward the circuit board 410 further than the deformable body 500 to be directly connected to the circuit board 410.

The third channel area 513, that is perpendicular to the expansion direction (e.g., the X axis direction) of the display, may be filled with the third electrode area 630. The third electrode area 630 may be disposed between the first electrode area 610 and the second electrode area 620. The third electrode area 630 may electrically connect the first electrode area 610 and the second electrode area 620. A width of the third electrode area 630 may be changed according to an extent of the display 160, exposed to an outside. For example, the width of the third electrode area 630 may be increased as the extent of the display 160 exposed to the outside is increased.

According to an embodiment, a length of the third electrode area 630 may be shorter than those of the first electrode area 610 and the second electrode area 620. An occupation degree of the third electrode area in the total resistance value of the liquid-state electrode 600 may be lower than occupation degrees of the resistance values of the first electrode area 610 and the second electrode area 620. For example, the resistance value of the third electrode area 630 in the total resistance value of the liquid-state electrode 600 may be small enough to be ignored. Accordingly, when the display 160 is expanded and contracted, an influence of the resistance value of the third electrode area 630 on the resistance change rate of the liquid-state electrode 600 may be minimized.

In this way, because the deformable body 500 is tensile-deformed due to the expansion of the display 160, the first channel 510 formed in the interior of the deformable body 500 also may be tensile-deformed. Accordingly, the length of the liquid-state electrode 600 within the first channel 510 may be changed whereby the resistance component of the liquid-state electrode 600 is changed. The resistance of the liquid-state electrode 600, which is determined by the length and the cross-sectional area of the liquid-state electrode 600 may be increased as the length of the liquid-state electrode 600 is increased.

Figure 7A:
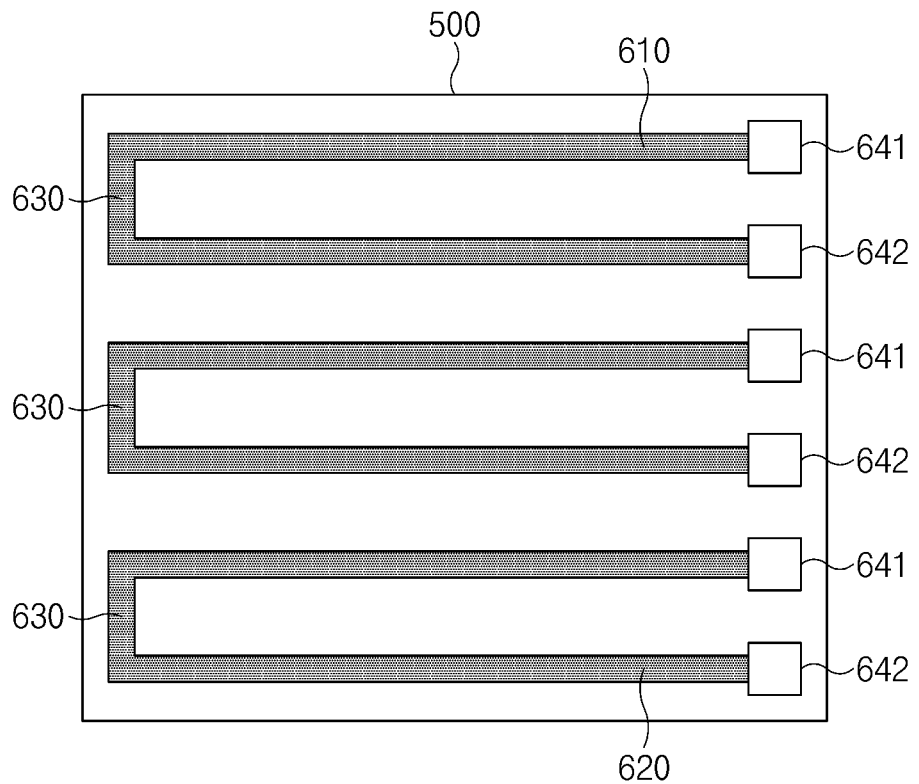
FIG. 7A is a view illustrating the deformable member according to an embodiment.
Figure 7A:
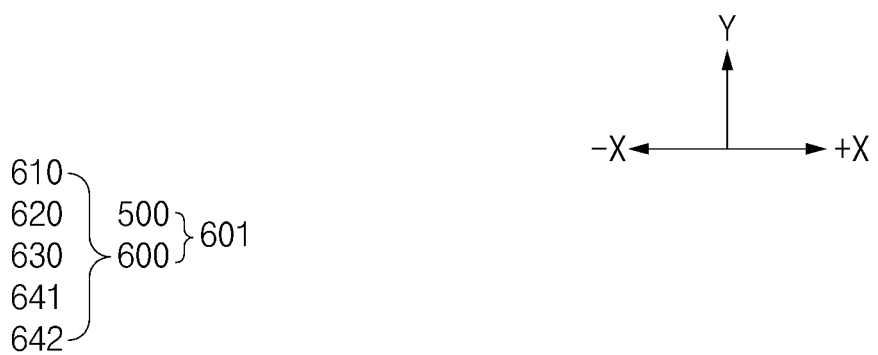
Figure 7B:
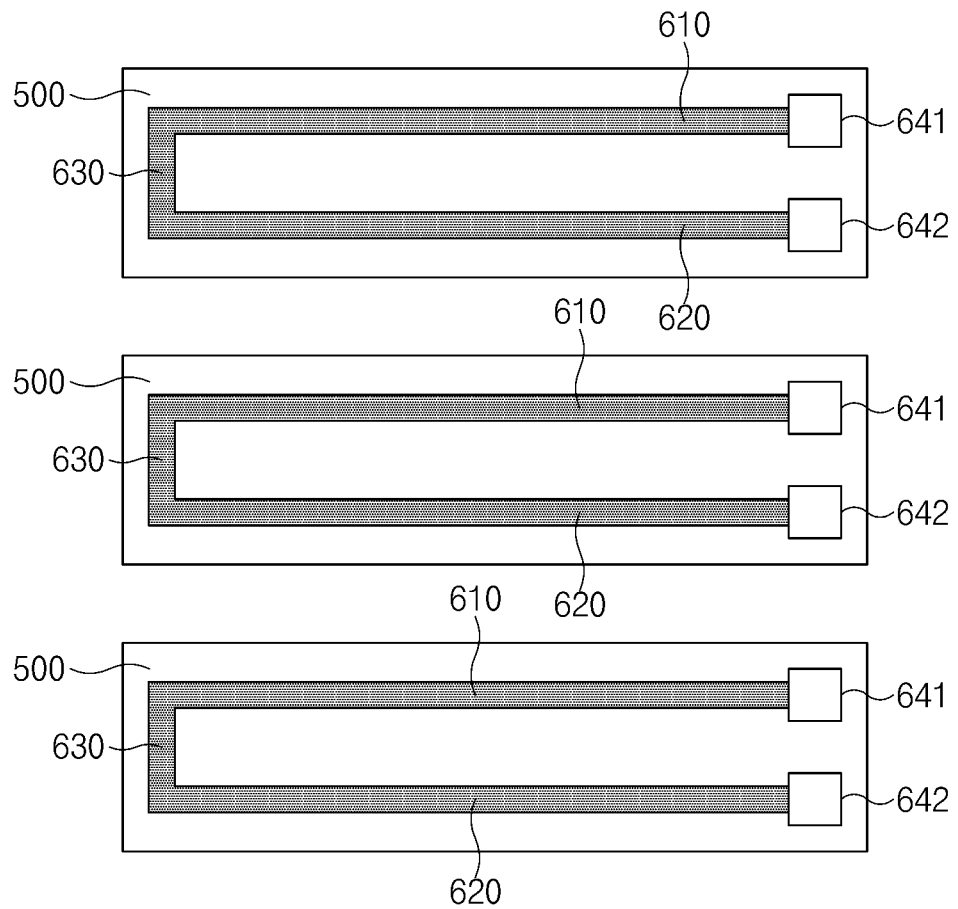
FIG. 7B is a view illustrating the deformable member according to an embodiment.
Figure 7C:
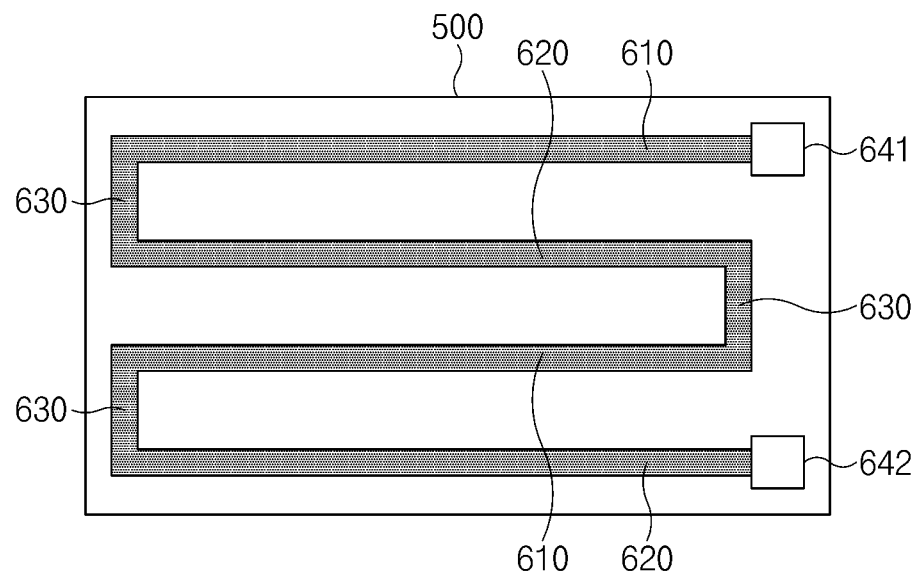
FIG. 7C is a view illustrating the deformable member according to an embodiment.
Figure 7C:
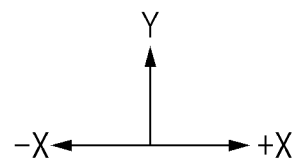

FIGS. 7A to 7C are views illustrating various embodiments of the deformable member included in the electronic device according to an embodiment.

In the deformable member 601 according to the embodiment illustrated in FIG. 7A, a plurality of the liquid-state electrode 600 may be disposed in one deformable body 500. Each of the plurality of the liquid-state electrode 600 may be spaced apart from adjacent ones of the plurality of the liquid-state electrode 600, at the same interval or different intervals. The plurality of the liquid-state electrode 600 may have a "C" shape.

In the deformable member 601 according to the embodiment illustrated in FIG. 7B, at least one liquid-state electrode 600 may be disposed in each of a plurality of the deformable body 500. Each of the plurality of the deformable body 500 may be spaced apart from adjacent ones of the plurality of the deformable body 500, at the same interval or different intervals. The plurality of the liquid-state electrode 600 may have a "C" shape.

In the deformable member 601 according to the embodiment illustrated in FIG. 7C, at least one liquid-state electrode 600 may be disposed in at least one deformable body 500 in a zigzag form. The liquid-state electrode 600 disposed in the at least one deformable body 500 may include a plurality of the first electrode area 610, a plurality of the second electrode area 620, a plurality of the third electrode area 630, one first contact area 641, and one second contact area 642.

Figure 8A:
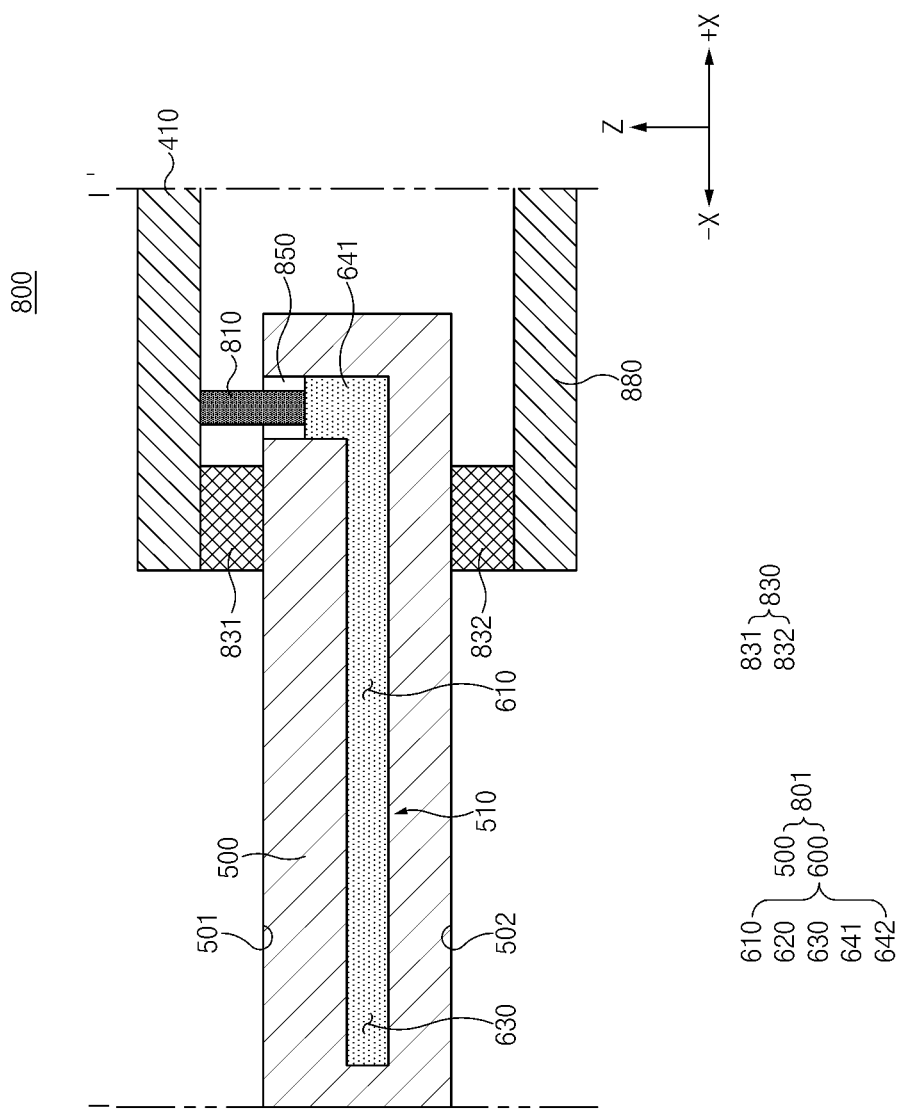
FIG. 8A is a first view illustrating an electronic device including a fixed structure coupled to the deformable member according to an embodiment.
Figure 8B:
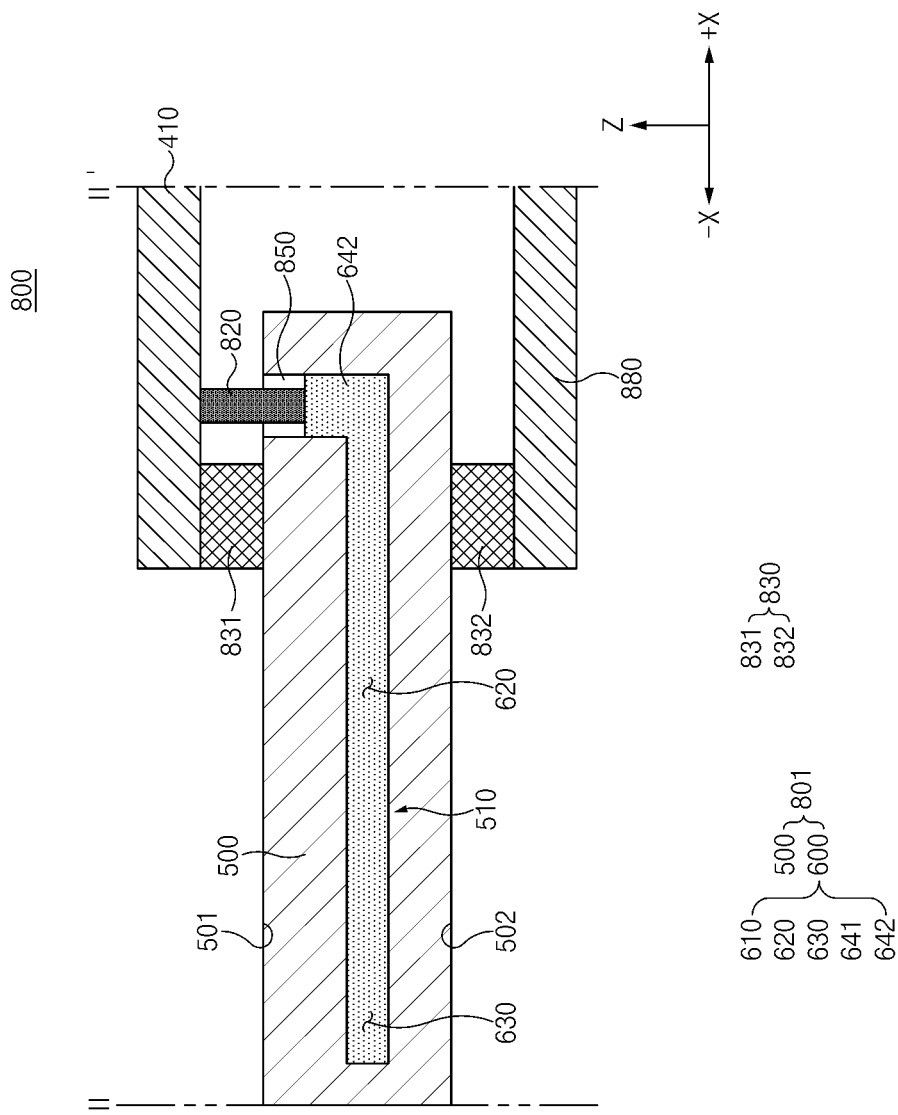
FIG. 8B is a second view illustrating the electronic device including the fixed structure coupled to the deformable member according to the embodiment.

FIGS. 8A and 8B are views illustrating an electronic device 800 including a deformable member 801 coupled to a first connector member 810 and a second connector member 820 according to various embodiments. At least any one of the elements of the electronic device 800 illustrated in FIGS. 8A and 8B may be the same as or similar to at least one of the elements of FIGS. 1 to 7, and thus a repeated description thereof will be omitted.

Referring to FIGS. 8A and 8B, the deformable member 801 may be electrically connected to the circuit board 410, through the first connector member 810 and the second connector member 820. The first connector member 810 and the second connector member 820, which pass through a sealing member 850, may be electrically connected to the circuit board 410, through a through-connection scheme.

The first connector member 810 may be disposed between the first contact area 641 and the circuit board 410 to electrically connect the first contact area 641 and the circuit board 410. The first connector member 810 may have a plate shape to have a line width that is smaller than that of the first contact area 641. The first connector member 810 may contact the first contact area 641 of the liquid-state electrode 600 in the interior of the deformable body 500.

The second connector member 820 may be disposed between the second contact area 642 and the circuit board 410 to electrically connect the second contact area 642 and the circuit board 410. The second connector member 820 may have a plate shape to have a line width that is smaller than that of the second contact area 642. The second connector member 820 may contact the second contact area 642 of the liquid-state electrode 600 in the interior of the deformable body 500.

The first connector member 810 and the second connector member 820 may be formed to pass through the sealing member 850. The sealing member 850 may seal a space in an interior of the first channel 510, in which the liquid-state electrode 600 is disposed. Because the liquid-state electrode 600 may be prevented from being leaked to the outside by the sealing member 850, an air gap may be prevented from being formed in the interior of the first channel 510. The sealing member 850 may be formed of the same material as that of the deformable body 500.

According to an embodiment, the first connector member 810 and the second connector member 820 may be formed to pass through the sealing member 850 after the liquid-state electrode 600 is sealed in the first channel 510 by the sealing member 850. According to another embodiment, the first connector member 810 and the second connector member 820 may be formed to contact the liquid-state electrode 600 after the liquid-state electrode 600 is provided within the first channel 510. Thereafter, the space in the interior of the channel may be sealed by the sealing member 850.

According to an embodiment, the deformable member 801 may be coupled to a fixed structure 830. The fixed structure 830 may include a first fixed structure 831 and a second fixed structure 832. The first fixed structure 831 may be integrally formed with the circuit board 410 with the same material as that of the circuit board 410 or may be formed of a material that is more rigid than that of the deformable member 801 and be coupled to the circuit board 410. The second fixed structure 832 may be integrally formed with a mechanism 880 with the same material as that of the mechanism 880 or may be formed of a material that is more rigid than that of the deformable member 801. The mechanism 880 may be a housing (e.g., the first housing 181 or the second housing 182 of FIG. 1), or the circuit board 410.

The first fixed structure 831 may be disposed between the circuit board 410 and the first surface 501 of the deformable body 500. The first fixed structure 831 may overlap a partial area of the first electrode area 610, which is adjacent to the first contact area 641. The first fixed structure 831 may press the deformable body 500 in a rearward direction (e.g., the −Z axis direction) that faces from the first surface 501 toward a second surface 502 of the deformable body 500.

The second fixed structure 832 may be disposed between the mechanism 880 and the second surface 502 of the deformable body 500. The second fixed structure 832 may overlap with the first fixed structure 831 while the deformable member 801 is interposed therebetween. Like the first fixed structure 831, the second fixed structure 832 may overlap with a partial area of the second electrode area 620, which is adjacent to the second contact area 642. The second fixed structure 832 may press the deformable body 500 in a forward direction (e.g., the +Z axis direction) that faces from the second surface 502 toward the first surface 501 of the deformable body 500.

Due to the self-weights of the first fixed structure 831 and the second fixed structure 832, the deformable body 500 may be pressed in the forward direction and the rearward direction. The structures disposed on a left side, which faces in the second direction (e.g., the −X axis direction) with respect to the first fixed structure 831 and the second fixed structure 832 may be moved along the panel support part (e.g., the panel support part 170 of FIG. 4). For example, as the panel support part is moved, sizes of a portion of the deformable body 500, at least a portion of the first electrode area 610, at least a portion of the second electrode area 620, and the third electrode area 630 may be changed. Movements of the structures disposed on a right side, which faces in the first direction (e.g., the +X axis direction) with respect to the first fixed structure 831 and the second fixed structure 832 may be restricted or minimized even though the panel support part is operated (or an exposure area of the display is changed). For example, due to the first fixed structure 831 and the second fixed structure 832, movement of at least any one of the first connector member 810, the second connector member 820, the circuit board 410, the first contact area 641, and the second contact area 642 may be minimized or restricted.

In this way, a location of a partial area of the deformable member 801 may be fixed by the first fixed structure 831 that presses the deformable member 801 in the rearward direction and the second fixed structure 832 that presses the deformable member 801 in the forward direction. When the exposure area of the display is expanded and contracted, a deformation rate of at least any one of the first contact area 641 and the second contact area 642 may be smaller than a deformation rate of at least any one of the first electrode area 610 and the second electrode area 620. For example, even though the exposure area of the display is expanded and contracted, the first contact area 641 and the second contact area 642 of the liquid-state electrode 600 may not be deformed. Accordingly, when the exposure area of the display is expanded and contracted, the circuit board 410 and the first connector member 810 and the second connector member 820 may be electrically connected to each other stably through the first contact area 641 and the second contact area 642, which are not deformed. Furthermore, the electrical connection of the circuit board 410 and the first connector member 810 and the second connector member 820 may be maintained stably.

According to an embodiment, at least any one of the first connector member 810 and the second connector member 820 may be disposed to be spaced apart from the first fixed structure 831. As another embodiment, at least any one of the first connector member 810 and the second connector member 820 may be disposed to contact the first fixed structure 831.

According to an embodiment, surfaces of the first fixed structure 831 and the second fixed structure 832, which contact the deformable body 500, may have the same or different surface areas. A pressure applied to the first surface 501 of the deformable body 500 through the first fixed structure 831 may be the same as or different from a pressure applied to the second surface 502 of the deformable body 500 through the second fixed structure 832.

Figure 9A:
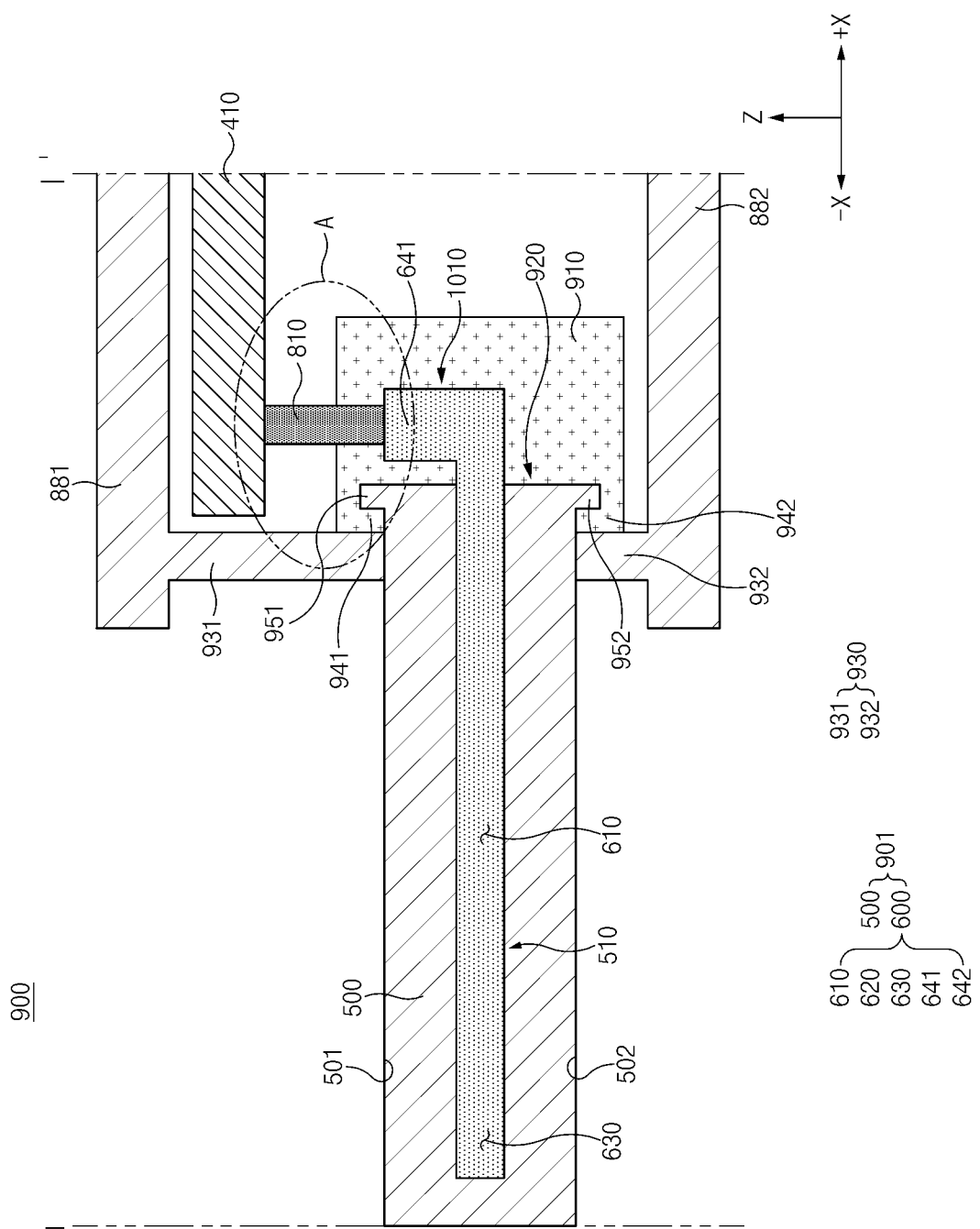
FIG. 9A is a first view illustrating an electronic device including a fixed structure coupled to the deformable member according to another embodiment.
Figure 9B:
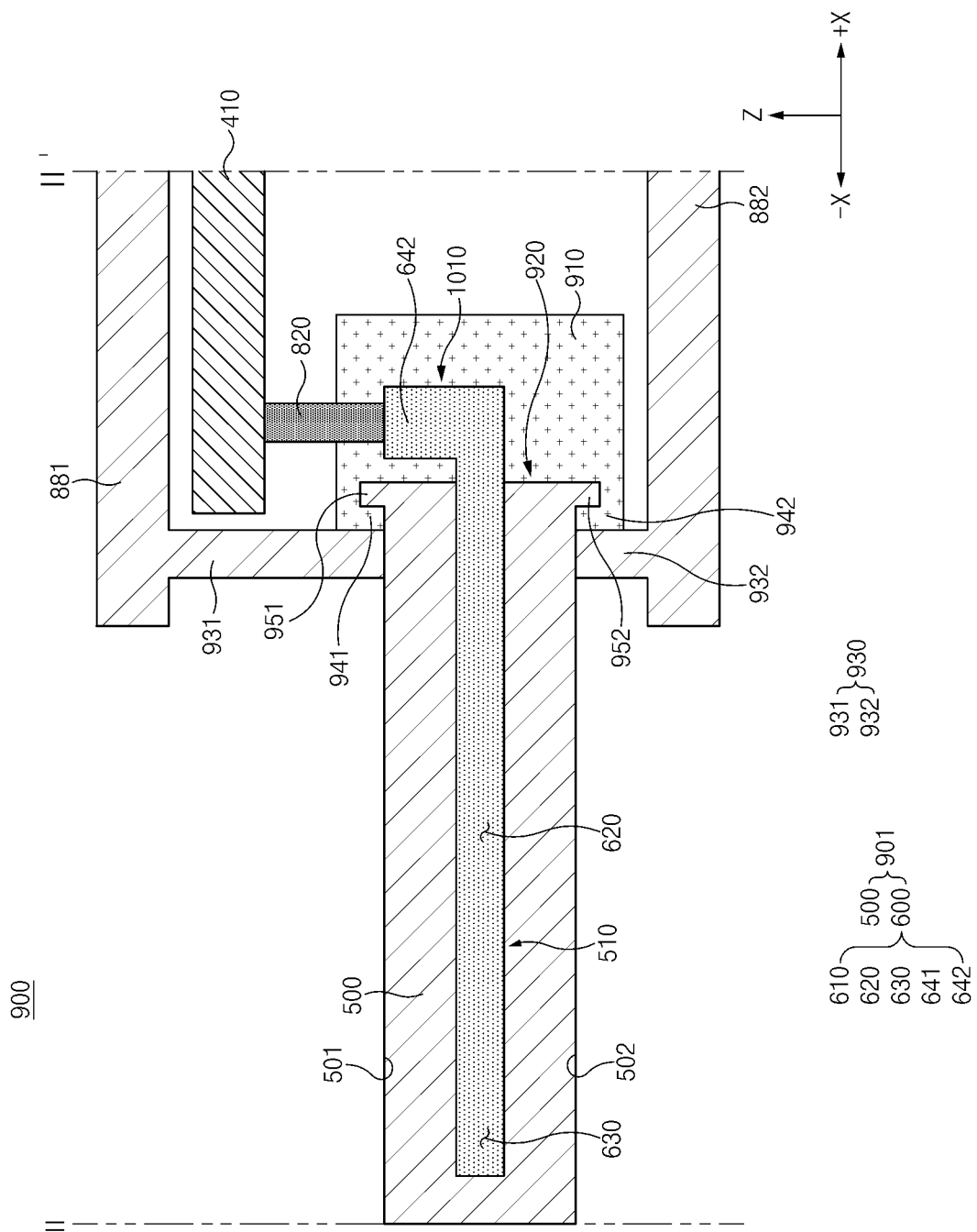
FIG. 9B is a second view illustrating the electronic device including the fixed structure coupled to the deformable member according to the another embodiment.
Figure 10:
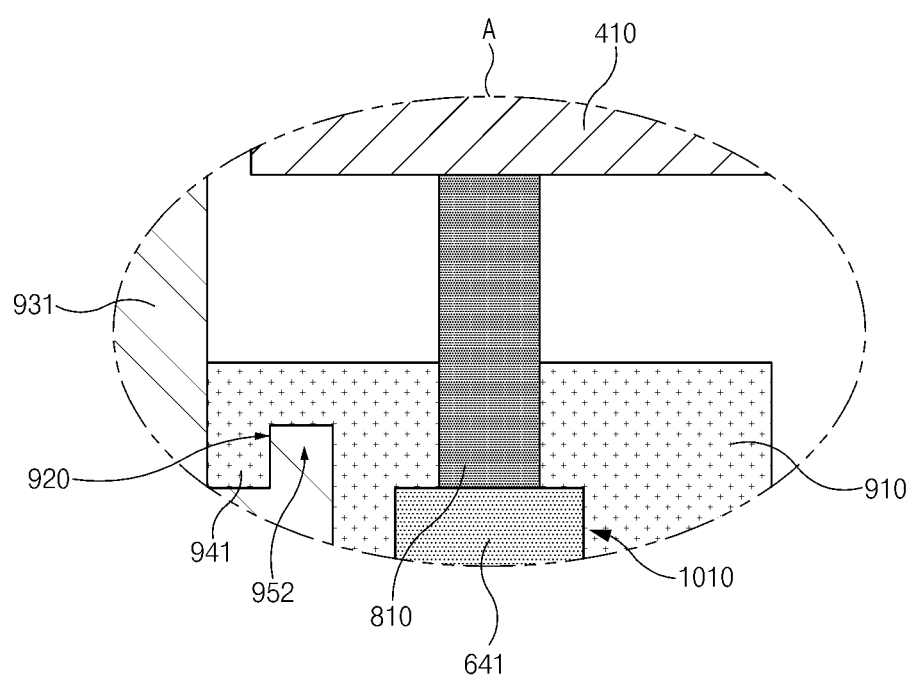
FIG. 10 is an enlarged view illustrating of area "A" in FIG. 9A.

FIGS. 9A and 9B are views illustrating an electronic device 900 including a deformable member coupled to a rigid member according to another embodiment. FIG. 10 is an enlarged view illustrating of area "A" in FIG. 9A.

Referring to FIGS. 9A to 10, the electronic device 900 according to various embodiments may include a deformable member 901, and a rigid member 910 coupled to the deformable member 901. At least any one of the elements of the electronic device 900 may be the same as or similar to at least one of the elements of FIGS. 1 to 8B, and thus a repeated description thereof will be omitted.

According to an embodiment, the deformable member 901 may include a first fixing boss 951 and a second fixing boss 952 coupled to the rigid member 910. The first fixing boss 951 may protrude from the first surface 501 of the deformable body 500 toward the circuit board 410 in a forward direction (e.g., the +Z axis direction). The second fixing boss 952 may protrude from the second surface 502 of the deformable body 500 in a rearward direction (e.g., the −Z axis direction) that is opposite to the first fixing boss 951.

The rigid member 910 may surround one side surface of the deformable body 500, which faces in the first direction (e.g., the +X axis direction). The rigid member 910 may include a fixing recess 920 that is formed by recessing an opposite side surface (e.g., a surface that faces in the −X axis direction) of the rigid member 910, which is adjacent to surroundings of the deformable body 500. The fixing recess 920 may be formed to be concave toward the second direction (e.g., the −X axis direction). According to an embodiment, the fixing recess 920 may include at least two areas having different widths due to a first stopper step 941 and a second stopper step 942 of the rigid member 910. A partial area of the deformable member 601, in which the first fixing boss 951 and the second fixing boss 952 are formed, may be inserted into a partial area of the fixing recess 920 corresponding to the first stopper step 941 and the second stopper step 942, respectively. A partial area of the deformable member 601, in which neither the first fixing boss 951 nor the second fixing boss 952 is formed, may be inserted into the remaining area of the fixing recess 920, which does not correspond to the first stopper step 941 and the second stopper step 942. When the first fixing boss 951 and the second fixing boss 952 are inserted into the fixing recess 920, the deformable member 601 is made to be difficult to be separated from the rigid member 910 again due to the first stopper step 941 and the second stopper step 942 of the rigid member 910.

The rigid member 910 may include the first stopper step 941 and the second stopper step 942 at an end thereof. The first stopper step 941 may be formed toward the first surface 501 of the deformable body 500 in an opposite direction to the first fixing boss 951. The first stopper step 941 may contact the first surface 501 of the deformable body 500. Because the first stopper step 941 is engaged with the first fixing boss 951 to surround the first fixing boss 951, the rigid member 910 may be stably coupled to the deformable body 500. The second stopper step 942 may be formed toward the second surface 502 of the deformable body 500 in an opposite direction to the second fixing boss 952. The second stopper step 942 may contact the second surface 502 of the deformable body 500. Because the second stopper step 942 is engaged with the second fixing boss 952 to surround the second fixing boss 952, the rigid member 910 may be stably coupled to the deformable body 500.

According to an embodiment, the rigid member 910 may be formed of a material, of which a deformation rate due to an external force is lower than that of the deformable member 901. The rigid member 910 may include a second channel 1010 connected to the first channel 510 of the deformable member 901. The first electrode area 610, the second electrode area 620, and the third electrode area 630 of the liquid-state electrode 600 may be within the first channel 510 of the deformable member 901. The first contact area 641 and the second contact area 642 of the liquid-state electrode 600 may be within a portion of the second channel 1010 of the rigid member 910. A portion of the first connector member 810 and a portion of the second connector member 820 may be disposed at the remaining portions of the second channel 1010 of the rigid member 910.

The first contact area 641 may be electrically connected to the circuit board 410 in the rigid member 910 through the first connector member 810. The second contact area 642 may be electrically connected to the circuit board 410 in the rigid member 910 through the second connector member 820.

According to an embodiment, the deformable member 901 may be coupled to a fixed structure 930. The fixed structure 930 may include a first fixed structure 931 and a second fixed structure 932. The first fixed structure 931 may be integrally formed with a first mechanism 881 with the same material as that of the first mechanism 881, or may be formed of a material that is similar to or different from that of the rigid member 910 to be coupled to the first mechanism 881. The second fixed structure 832 may be integrally formed with a second mechanism 882 with the same material as that of the second mechanism 882, or may be formed of a material that is similar to or different from that of the rigid member 910 to be coupled to the second mechanism 882. The first mechanism 881 and the second mechanism 882 may be a housing (e.g., the first housing 181 or the second housing 182 of FIG. 1), or the circuit board 410. The first mechanism 881 and the second mechanism 882 may be physically separated from each other or be integrally formed with each other.

The first fixed structure 931 may contact a partial area of the deformable body 500, which is adjacent to the first contact area 641 and the second contact area 642, and may contact the first stopper step 941 of the rigid member 910. The first fixed structure 931 may press the deformable body 500 in a rearward direction (e.g., the −Z axis direction) that faces from the first surface 501 toward the second surface 502.

The second fixed structure 932 may contact a partial area of the deformable body 500, which is adjacent to the second stopper step 942 of the rigid member 910, and may contact the second stopper step 942 of the rigid member 910. The second fixed structure 832 may press the deformable body 500 in a forward direction (e.g., the +Z axis direction) that faces from the second surface 502 toward the first surface 501 of the deformable body 500.

Due to the self-weights of the first fixed structure 931 and the second fixed structure 932, the deformable body 500 may be pressed in the forward direction and the rearward direction. The structures disposed on a left side, which faces in the second direction (e.g., the −X axis direction) with respect to the first fixed structure 931 and the second fixed structure 932 may be moved along the panel support part (e.g., the panel support part 170 of FIG. 4). For example, as the panel support part is moved, sizes of a portion of the deformable body 500, the first electrode area 610, the second electrode area 620, and the third electrode area 630 may be changed. Movements of the structures disposed on a right side, which faces in the first direction (e.g., the +X axis direction) with respect to the first fixed structure 931 and the second fixed structure 932 may be restricted or minimized even though the panel support part is operated (or an exposure area of the display is changed). For example, due to the first fixed structure 931 and the second fixed structure 932, movement of at least any one of the rigid member 910, the first connector member 810, the second connector member 820, the circuit board 410, the first contact area 641, and the second contact area 642 may be minimized or restricted.

In this way, locations of the rigid member 910 and the structures disposed around the rigid member 910 may be fixed by the first fixed structure 831 that presses the deformable member 801 in the rearward direction and the second fixed structure 832 that presses the deformable member 801 in the forward direction. When the exposure area of the display is expanded and contracted, a deformation rate of at least any one of the first contact area 641 and the second contact area 642, which are disposed in the rigid member 910, may be smaller than a deformation rate of at least any one of the first electrode area 610 and the second electrode area 620. For example, even though the exposure area of the display is expanded and contracted, the first contact area 641 and the second contact area 642 disposed in the rigid member 910 may not be deformed. Accordingly, when the exposure area of the display is expanded and contracted, the circuit board 410 and the first connector member 810 and the second connector member 820 may be electrically connected to each other stably through the first contact area 641 and the second contact area 642, which are not deformed. Furthermore, the electrical connection of the circuit board 410 and the first connector member 810 and the second connector member 820 may be maintained stably.

Figure 11:
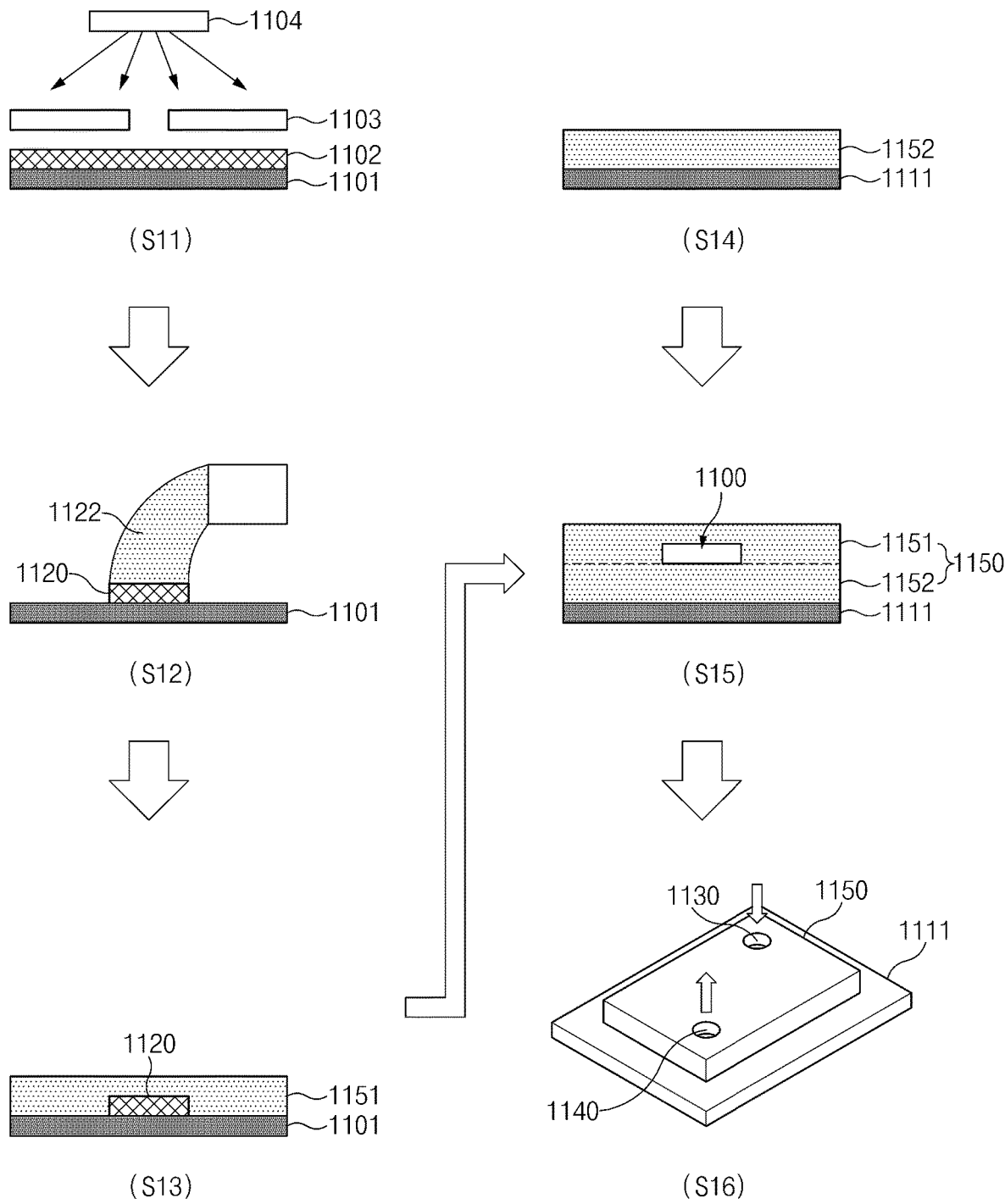
FIG. 11 is a view for explaining a method for manufacturing a deformable member according to an embodiment.
Figure 12:
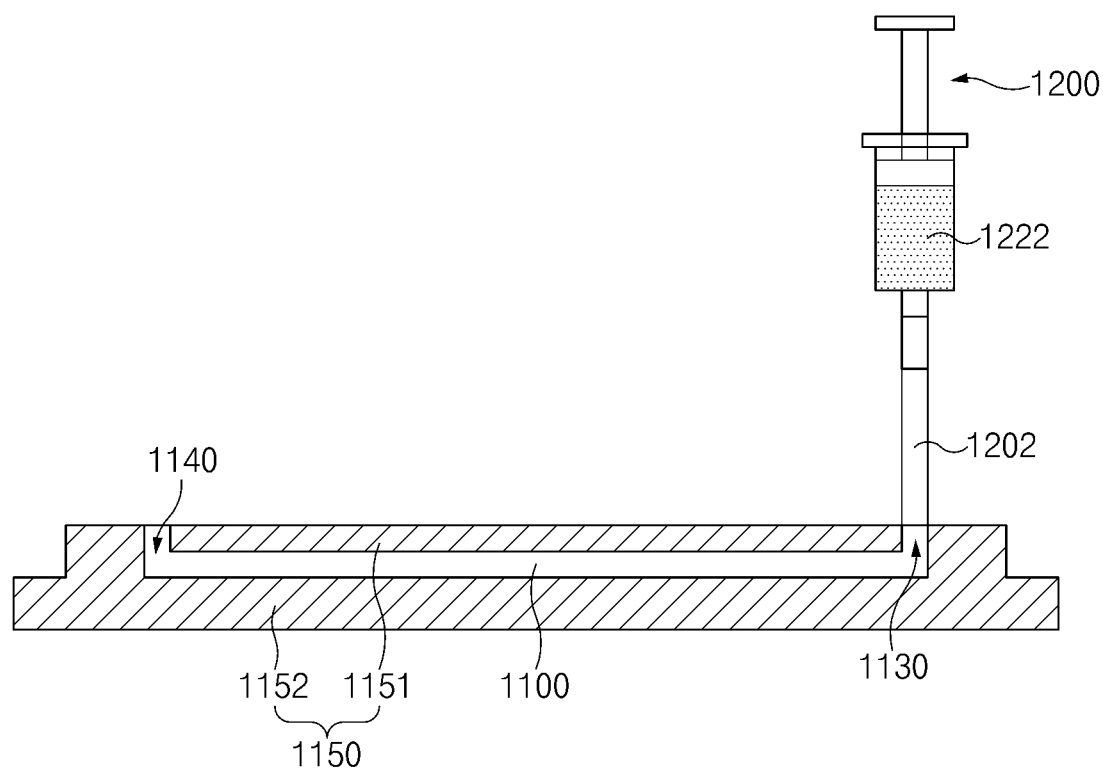
FIG. 12 is a view illustrating a syringe used during an injection process illustrated in FIG. 11.

FIG. 11 is a view for explaining a method for manufacturing a deformable member according to various embodiments. FIG. 12 is a view illustrating an injection process illustrated in FIG. 11 in detail.

Referring to FIGS. 11 and 12, a method for manufacturing a deformable member may include a first mold forming process, a second mold forming process, a joining process, and an injection process.

In operation S11, after a photoresist 1102 is applied onto the entire surface of a first base substrate 1101, the photoresist 1102 may be patterned through the exposure and development processes using a photo mask 1103 and a light source 1104.

In operation S12, the surface of the first base substrate 1101 having a patterned photoresist (or the photoresist pattern 1120) may be released. For example, a surface of the first base substrate 1101, which does not overlap the photoresist pattern 1120, and a surface of the photoresist pattern 1120, which does not contact the first base substrate 1101 may be released from each other.

After the releasing, a first mold material 1122 may be applied onto the first base substrate 1101. The first mold material 1122 may be formed by mixing a first main agent that is an elongating material and a first curing agent. For example, the first main agent and the first curing agent of the first mold material 1122 may be mixed at a weight ratio of 10:2.

In operation S13, as the first mold material 1122 applied onto the first base substrate 1101 is preliminarily cured, a first mold 1151 formed of the first mold material may be formed on the first base substrate 1101. The first mold 1151 may be formed to cover the photoresist pattern 1120 and the first base substrate 1101.

In operation S14, a second mold 1152 may be formed by applying the second mold material onto a second base substrate 1111 that is provided from the first base substrate 1101 and then preliminarily curing the second mold material. The second mold material may be formed by mixing a second main agent that is an elongating material and a second curing agent. The second main agent may be a material that is the same as or different from the first main agent. The second curing agent may be a material that is the same as or different from that of the first curing agent. The second curing agent may be mixed with the second main agent at a weight ratio that is lower than that of the first curing agent. For example, the second main agent and the second curing agent of the first mold material may be mixed at a weight ratio of 10:0.5. The second mold 1152 may have bonding characteristics in which the ratio of the curing agent of the second mold 1152 is lower than that of the first mold 1151. The second mold 1152 may function as an adhesive during a process of being joined with the first mold 1151.

In operation S15, the first mold 1151 may be released from the photoresist pattern 1120 and the first base substrate 1101. The second mold 1152 may be released from the second base substrate 1111. After the released first mold 1151 is aligned on the second mold 1152, they may be mainly cured. A curing temperature of the main curing may be higher than that of the preliminary curing or a curing time of the main curing may be longer than that of the preliminary curing. Accordingly, a deformable body 1150 including the first mold 1151 and the second mold 1152 may be formed. A channel 1100 may be formed between the first mold 1151 and the second mold 1152. The channel 1100 may correspond to a size of the photoresist pattern 1120 released from the first mold 1151. At least one hole may be formed in the deformable body 1150. According to an embodiment, at least one injection hole may be formed in the deformable body 1150. The at least one injection hole may be formed of any one of the first mold 1151 and the second mold 1152 to be connected to the channel 1100. According to another embodiment, at least one injection hole (e.g., an injection hole 1130 of operation S16, which will be described below) and at least one exhaust hole (e.g., an exhaust hole 1140 of operation S16, which will be described below) may be formed in the deformable body 1150. At least any one of the at least one injection hole and the at least one exhaust hole may be formed of any one of the first mold 1151 and the second mold 1152 to be connected to the channel 1100.

In operation S16, after a liquid-state metal 1222 is filled in a syringe 1200, a discharge hole of the syringe 1200 may be connected to a tube 1202 as shown in FIG. 12. The tube 1202 connected to the syringe 1200 may be connected to at least one hole of the deformable body 1150. For example, the tube 1202 may be connected to at least one injection hole 1130 formed in the deformable body 1150. A diameter of the tube 1202 may coincide with a diameter of the at least one injection hole 1130. Thereafter, when a piston of the syringe 1200 is pushed, the liquid-state metal 1222 in the syringe 1200 may be injected into the channel 1100 of the deformable body 1150 through the injection hole 1130.

According to an embodiment, at least one injection hole 1130 and at least one exhaust hole 1140 may be formed in the deformable body 1150. When an interior of the channel 1100 is maintained in a vacuum state through the at least one exhaust hole 1140, bubbles in the interior of the channel 1100 may be removed. Accordingly, the liquid-state metal 1222 injected through the at least one injection hole 1130 may be easily filled in an empty space of the interior of the channel 1100 due to a capillary phenomenon and a pressure difference. The liquid-state metal 1222 filled in the interior of the channel may be used as a liquid-state electrode (e.g., the liquid-state electrode 600 of FIGS. 9A and 9B), a resistance value of which is changed when the display is expanded and contracted.

Figure 13:
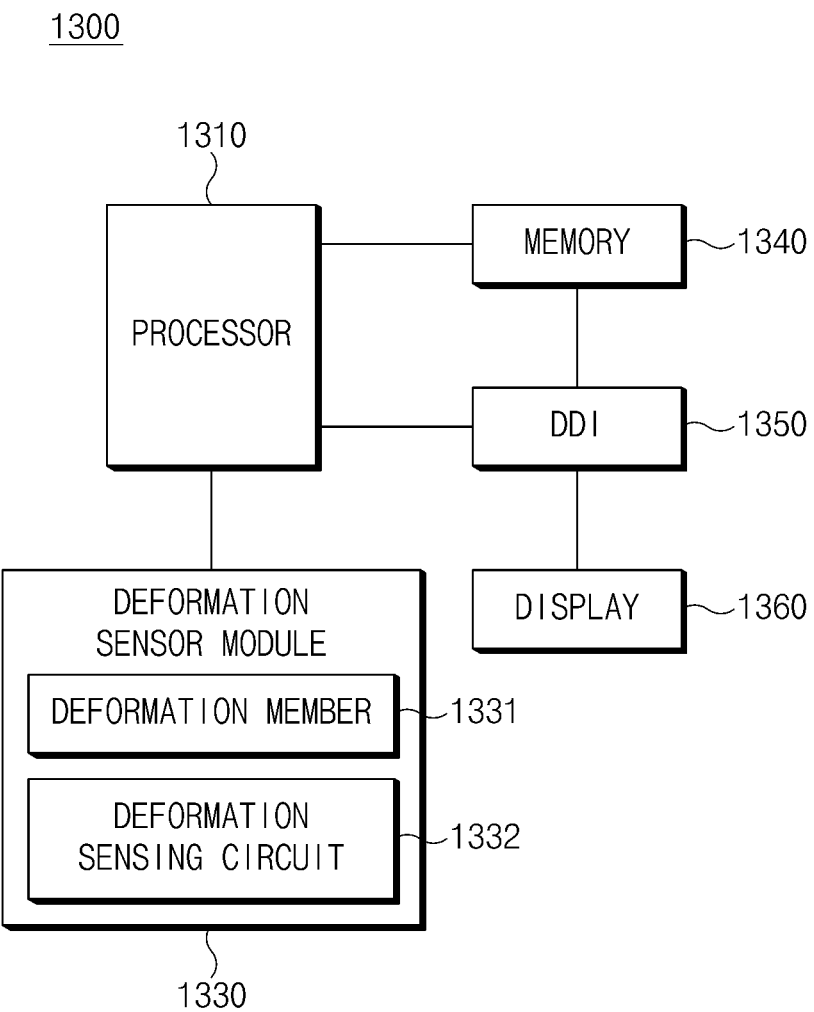
FIG. 13 is a block diagram illustrating an electronic device including a deformation sensor module according to an embodiment.

FIG. 13 is a block diagram of an example of an electronic device according to various embodiments.

Referring to FIG. 13, an electronic device 1300 according to various embodiment may include a display 1360 (e.g., the display 160 of FIG. 1), a deformation sensor module 1330, a processor 1310, a memory 1340, and a display driver IC (DDI) 1350.

The deformation sensor module 1330 may include a deformable member 1331 (e.g., the deformable member 601 of FIGS. 6A and 6B, the deformable member 801 of FIGS. 8A and 8B, or the deformable member 901 of FIGS. 9A and 9B), and the deformation sensing circuit 1332 that controls the deformable member 1331. The deformation sensing circuit 1332 may sense a resistance value of the deformable member 1331 increase as a screen of the display 1360 is expanded.

The processor 1310 may determine an expansion degree of the screen of the display 1360 based on the sensed resistance value of the deformable member 1331, and may control the display driver IC 1350 and the memory 1340 according to a situation when a specified application is executed.

According to an embodiment, the deformation sensing circuit 1332 may be embedded in the processor 1310. The deformation sensing circuit 1332 embedded in the processor 1310 may sense the resistance value of the deformable member 1331, and may determine the expansion degree of the display 1360 based on the sensed resistance value of the deformable member 1331. For example, the processor 1310 may implement the deformation sensing circuit 1332.

The memory 1340 may store instructions for controlling the processor 1310 to perform various operations, including any number of functions of the processor 1310 (and/or deformation sensing circuit 1332). For example, the memory 1340 may store instructions for performing a control to display image information on a screen that is visually exposed.

The display driver IC 1350 may receive image information including image data or an image control signal corresponding to a command for controlling the image data, from the processor 1310. The display driver IC 1350 may store at least a portion of the image information received through the processor 1310 in the memory 1340 in unit of frames. The display driver IC 1350 may transmit a driving signal to the display 1360 such that an image is displayed on a screen, a size of which has been changed, based on the image information received from the processor 1310.

Figure 14:
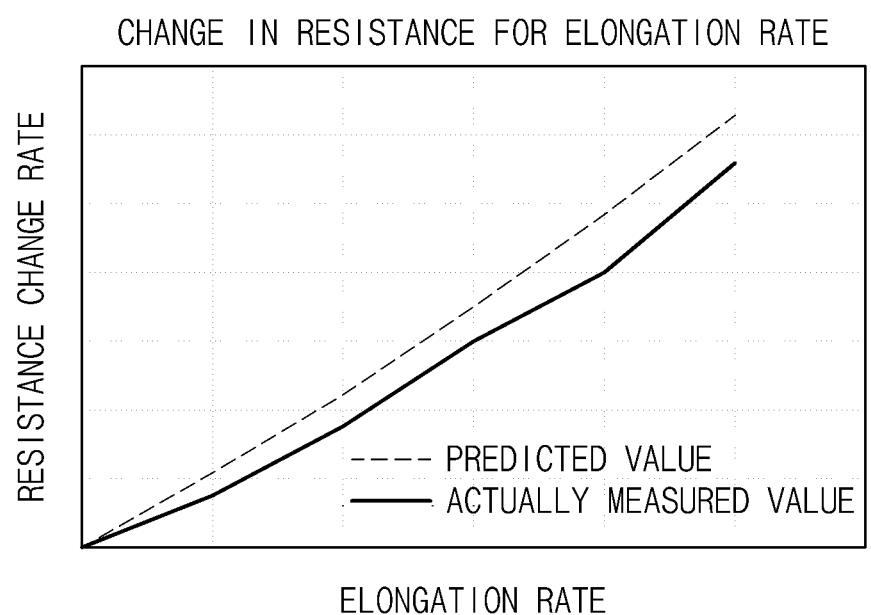
FIG. 14 is a view illustrating a resistance change rate of a deformable member according to a elongation rate of the deformable member included in an electronic device according to an embodiment.

According to an embodiment, the resistance value of the deformable member 1331, which is sensed by the deformation sensing circuit 1332, may be proportional to a change rate of a length of the deformable member 1331. As a length of the liquid-state electrode included in the deformable member 1331 increases (that is, a elongation rate increases), the resistance change rate of the liquid-state electrode also may increase as illustrated in FIG. 14.

A predicted value of the change in the resistance value according to the elongation rate of the liquid-state electrode included in the deformable member 1331 may be different from an actually measured value. The predicted value and the actually measured value for the change in the resistance value according to the elongation rate of the liquid-state electrode may increase in a form of a linear primary function as illustrated in FIG. 14. For example, as the elongation rate of the deformable member 1331 increases, the predicted value and the actually measured value for the change in the resistance value may increase in a form of a linear primary function. Accordingly, because a difference between the predicted value for the change in the resistance value and the actually measured value may decrease by updating of firmware, the predicted value for the change in the resistance value may be generated as an optimum result value without being actually measured. Parameters for reducing a difference between the predicted value and the measured value for the change in the resistance value may be stored in the memory 1340. Further, algorithms for deriving parameters for reducing a difference between the predicted value and the measured value for the change in the resistance value may be stored in the memory 1340. The parameters stored in the memory 1340 are calculated by manufacturers through machine learning, and may be renewed through periodical updating of firmware.

According to an embodiment, an initial resistance value before elongation of the deformable member 1331, which is detected by the deformation sensing circuit 1332 may be substantially the same as a restored resistance value, which is restored after the elongation. The initial resistance value and the restored resistance value may be different by an error degree of an allowable level. Furthermore, the initial resistance value of the deformable member 1331 before the repeated elongations and the restored resistance value restored after the repeated elongations may be substantially the same. Accordingly, because the deformable member 1331 may restore the same electrical characteristics even after the repeated elongations, a durability thereof may be excellent. Examples of resistance values of the deformable member 1331 having various channel widths, and at various elongation percentages, is provided below in TABLE 1.

TABLE 1

| Channel width (μm) | | 30 | 50 | 100 | 150 |
|---|---|---|---|---|---|
| elongation %/ | 0% (initial) | 15.7 | 7.6 | 3.5 | 2.6 |
| resistance values | 10% | 17.2 | 8.6 | 4.1 | 2.7 |
| | 20% | 20 | 10.3 | 4.7 | 3.2 |
| | 30% | 21.9 | 11.9 | 5.3 | 3.5 |
| | Restored | 15.6 | 7.6 | 3.5 | 2.4 |

According to an embodiment, an initial resistance value before elongation of the deformable member 1331, which is detected by the deformation sensing circuit 1332 may be substantially different from a restored resistance value, which is restored after the elongation. For example, as in TABLE 2, the initial resistance value before the elongation may be substantially different from the restored resistance value restored after 1000 or more elongations.

TABLE 2

| Channel width (μm) | | 30 |
|---|---|---|
| elongation %/ | 0% (Initial) | 15.7 |
| resistance values | 10% | 17.2 |
| | 20% | 20 |
| | 30% | 21.9 |
| | Restored after 100 repetitions | 12.1 |

After sensing characteristics of deviations of the initial resistance value and the restored resistance value, the deformation sensing circuit 1332 may apply a compensation value, corresponding to the deviation characteristics according to the number of repeated elongations, to at least any one of the restored resistance value and the measured resistance value measured after the repeated elongations. The deformation sensing circuit 1332 may correct a resistance change rate of the deformable member 1331 by using a compensation value. The compensation value may be stored in a lookup table included in the memory 1340. The lookup table may be generated when the electronic device is manufactured or be downloaded through data communication to be stored in the memory 1340.

Figure 15:
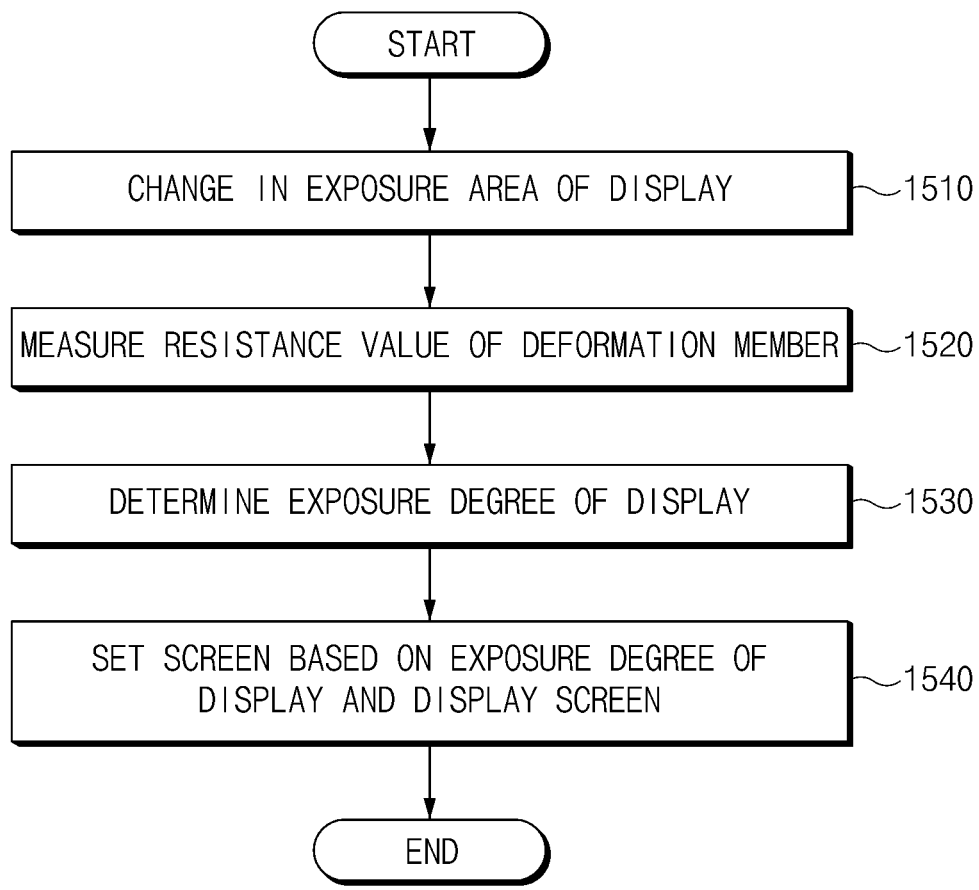
FIG. 15 is a view illustrating an example of a method for operating an electronic device according to various embodiments.

FIG. 15 is a view illustrating an example of a method for operating an electronic device according to various embodiments.

Referring to FIG. 15, in operation 1510, an electronic device (e.g., the electronic device 100 of FIG. 1) may be changed from a closed state (e.g., the first state 101 of FIG. 1) to the opened state (e.g., the second state 103 of FIG. 1) or from the opened state to the closed state. When the electronic device is changed from the closed state to the opened state, a screen area (or a display area) of a display (e.g., the display 160 of FIG. 1) may be expanded from a first size to a second size that is larger than the first size and may be exposed. When the electronic device is changed from the opened state to the closed state, the screen area of the display may be exposed by the first size that is contracted from the second size.

In operation 1520, as the size of the exposed screen area of the display is changed, a length of a deformable member (e.g., the deformable member of FIGS. 6A and 6B, the deformable member 801 of FIGS. 8A and 8B, or the deformable member 901 of FIGS. 9A and 9B) may be changed. When the size of the exposed screen area of the display becomes larger, the length of the deformable member may become longer. When the size of the exposed screen area of the display becomes smaller, the length of the deformable member may become smaller. A deformation sensing circuit (e.g., the deformation sensing circuit 1332 of FIG. 13) may measure the resistance value of the deformable member, which is proportional to the length of the deformable member.

In operation 1530, a processor (e.g., the processor 1310 of FIG. 13) may determine an exposure degree of the exposed screen area of the display through the resistance value measured through the deformation sensing circuit. For example, the processor may determine an exposure degree of a second area (e.g., the second display area 160b of FIG. 1) of the display. According to an embodiment, the processor may determine a ratio of a change (expansion or contraction) of the screen of the display by comparing a deformation resistance value measured after deformation of the deformable member, and an initial resistance value of the deformable member measured before the second area of the display is exposed.

In operation 1540, the processor may control a display driver IC (e.g., the display driver IC 1350 of FIG. 13) to be driven in response to a screen change ratio. The display driver IC may set a screen of an application based on a size of the exposed screen of the display to display the screen.

A rollable electronic device has been described as an example of the electronic device including the above-described deformable member, but embodiments of the disclosure are not limited thereto. The electronic device including the deformable member may be applied to an electronic device, such as a stretchable device or a wearable device, which may be deformed.

The various example embodiments of the disclosure and the terms used herein do not limit the technology described in the disclosure to specific forms, and the disclosure should be understood to include various modifications, equivalents, and/or replacements of the example embodiments. With regard to description of drawings, similar components may be marked by similar reference numerals. The terms of a singular form may include plural forms unless otherwise specified. In the disclosure, the expressions "A or B", or "at least one of A or/and B", "A, B, or C", or "at least one of A, B, or/and C", and the like used herein may include any and all combinations of one or more of the associated listed items. The terms, such as "first", "second", and the like used herein may refer to various elements of various embodiments of the disclosure, but do not limit the elements. For example, such terms are used only to distinguish an element from another element and do not limit the order and/or priority of the elements. If it is mentioned that an element (e.g., a first element) is (operatively or communicatively) "connected" to another element (e.g., a second element), the first element may be directly connected to the second element or may be connected to the second element through another element (e.g., a third element).

In the disclosure, the expression "configured to" may be interchangeably used with, for example, "suitable for", "capable of", "modified to", "made to", "able to", or "designed to" according to a situation in a hardware or software way. In some situations, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more programs which are stored in a memory device.

The term "module" used in the disclosure may include a unit configured in a hardware, software, or firmware way, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific integrated circuit (ASIC) chip, field-programmable gate arrays (FPGSs), or a programmable logic device that is known or to be developed in the future, which performs some operations.

At least some of the devices (e.g., modules or functions) or methods (e.g., operations) according to various embodiments of the disclosure may be implemented by an instruction stored in a computer-readable storage medium (e.g., the memory), for example, in the form of a program module. When the instruction is executed by the processor (for example, the processor), the processor may perform a function corresponding to the instruction. The computer-readable recording medium may include a hard disk, a floppy disk, a magnetic medium (e.g., a magnetic tape), an optical recording medium (e.g., a CD-ROM or a DVD), an magneto-optical medium (e.g., a floptical disk), and an embedded memory. The instruction may include a code made by a compiler or a code that may be executed by an interpreter.

Each of the elements (e.g., a module or a program) according to various embodiments may include a single or a plurality of entities, and some of the corresponding sub-elements may be omitted or another sub-element may be further included in various embodiments. Alternatively or additionally, some elements (e.g., a module or a program module) may be integrated into one entity to perform functions performed by the corresponding elements before the integration in the same way or similarly. The operations performed by a module, a program module, or another element according to various embodiments may be executed sequentially, in parallel, repeatedly, or heuristically, or at least some operations may be executed in another sequence or may be omitted, or another operation may be added.

The invention claimed is:

1. An electronic device comprising:
a flexible display that is configured to be deformable to a first state in which an exposed amount of a display area of the flexible display has a first size, and a second state in which the exposed amount of the display area is expanded in a first direction to have a second size that is larger than the first size;
a deformable member comprising a liquid-state electrode, the deformable member being configured to deform in a length direction of the deformable member based on the flexible display transitioning between the first state and the second state;
a deformation sensing circuit configured to sense a resistance component of the liquid-state electrode, the resistance component corresponding to an exposure degree of the display area;
a connector member electrically connecting the deformable member and the deformation sensing circuit;
a rigid member coupled to the deformable member and in which a portion of the connector member is disposed; and
a fixed structure contacting a partial area of the rigid member, the fixed structure being configured to press a portion of the deformable member, and configured to restrict movement of the rigid member in a second direction that is opposite to the first direction.

2. The electronic device of claim 1, wherein the liquid-state electrode comprises:
a first electrode area that extends in the second direction;
a second electrode area disposed in parallel to the first electrode area, and extending in the second direction; and
a third electrode area connecting the first electrode area and the second electrode area, and having a length in a third direction that is substantially perpendicular to the first direction.

3. The electronic device of claim 2, wherein a length of the third electrode area is smaller than a length of the first electrode area and a length of the second electrode area.

4. The electronic device of claim 2, further comprising:
a circuit board in which the deformation sensing circuit is disposed,
wherein the liquid-state electrode further comprises:
a first contact area formed from a portion of the first electrode area toward the circuit board; and
a second contact area formed from a portion of the second electrode area toward the circuit board.

5. The electronic device of claim 4, wherein a side of the liquid-state electrode in the first direction is adjacent and electrically connected to the connector member, and the liquid-state electrode extends in the second direction and is deformable in the second direction, and
wherein the deformable member further comprises a deformable body having a first channel in which the liquid-state electrode is accommodated.

6. The electronic device of claim 5, wherein the deformable body is formed of a first mold and a second mold that are joined together and have different shapes from each other,
wherein the first mold is a flat mold, and
wherein the second mold has a groove corresponding to the first channel.

7. The electronic device of claim 6, wherein a curing agent content of the second mold is higher than a curing agent content of the first mold.

8. The electronic device of claim 5, wherein the fixed structure comprises:
a first fixed structure configured to press a first surface of the deformable member, the first surface facing the flexible display in a fourth direction; and
a second fixed structure configured to press a second surface of the deformable member, the second surface facing in a fifth direction that is opposite to the fourth direction, and
wherein the first fixed structure overlaps the second fixed structure and the deformable body is interposed between the first fixed structure and the second fixed structure.

9. The electronic device of claim 5, wherein the rigid member surrounds a side surface of the deformable body, which faces in the first direction.

10. The electronic device of claim 5, wherein the deformable body comprises:
a first fixing boss protruding in a forward direction towards the flexible display; and
a second fixing boss protruding in a rearward direction that is opposite to the forward direction.

11. The electronic device of claim 10, wherein the rigid member comprises:
a first stopper step engaged with and coupled to the first fixing boss; and
a second stopper step engaged with and coupled to the second fixing boss, and
wherein at least one of the first stopper step and the second stopper step contacts the fixed structure.

12. The electronic device of claim 5, wherein the rigid member comprises:
a second channel connected to the first channel of the deformable body, and
wherein the first contact area and the second contact area are disposed at a portion of the second channel, and at least a portion of the connector member is disposed at another portion of the second channel.

13. The electronic device of claim 4, further comprising:
a panel support part disposed on a rear surface of the flexible display,
wherein the deformable member is disposed between the circuit board and the panel support part.

14. The electronic device of claim 1, wherein the liquid-state electrode comprises galinstan.

15. The electronic device of claim 1, further comprising:
a display driver configured to transmit a driving signal to the flexible display based on the exposure degree, which is determined by the electronic device based on the deformation sensing circuit sensing the resistance component.

16. An electronic device comprising:
a flexible display that is configured to be deformable to a first state in which an exposed amount of a display area of the flexible display has a first size, and a second state in which the exposed amount of the display area is expanded in a first direction to have a second size that is larger than the first size;
a liquid-state electrode configured to deform in a length direction of the liquid-state electrode based on the flexible display transitioning between the first state and the second state;

a deformable member comprising a deformable body accommodating the liquid-state electrode;

a deformation sensing circuit configured to sense a resistance component of the liquid-state electrode, the resistance component corresponding to an exposure degree of the display area;

a connector member electrically connecting the liquid-state electrode and the deformation sensing circuit; and a fixed structure configured to press a partial area of the deformable body, which is adjacent to the connector member, in a forward direction towards the flexible display and a rearward direction that is opposite to the forward direction such that movement of the connector member with respect to the fixed structure is restricted.

17. The electronic device of claim 16, further comprising:

a rigid member coupled to the deformable member, wherein at least a partial area of the rigid member contacts the fixed structure, and a portion of the connector member is disposed in an interior of the rigid member.

18. The electronic device of claim 17, wherein the deformable body comprises:

a first fixing boss protruding in the forward direction towards the flexible display; and a second fixing boss protruding in the rearward direction that is opposite to the forward direction.

19. The electronic device of claim 18, wherein the rigid member comprises:

a first stopper step engaged with and coupled to the first fixing boss; and a second stopper step engaged with and coupled to the second fixing boss, and wherein at least one of the first stopper step and the second stopper step contacts the fixed structure.

20. The electronic device of claim 16, further comprising:

a display driver configured to transmit a driving signal to the flexible display based on the exposure degree, which is determined by the electronic device based on the deformation sensing circuit sensing the resistance component.

* * * * *